United States Patent
Cho et al.

(10) Patent No.: US 11,509,419 B2
(45) Date of Patent: Nov. 22, 2022

(54) ACKNOWLEDGEMENT AND RETRANSMISSION TECHNIQUES UTILIZING SECONDARY WIRELESS CHANNEL

(71) Applicant: QUALCOMM Incorporated, San Diego, CA (US)

(72) Inventors: James Simon Cho, Stateline, NV (US); Youhan Kim, Saratoga, CA (US); Tao-Fei Samuel Ng, Fremont, CA (US); Vincent Knowles Jones, IV, Redwood City, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 114 days.

(21) Appl. No.: 17/030,034

(22) Filed: Sep. 23, 2020

(65) Prior Publication Data
US 2021/0091887 A1 Mar. 25, 2021

Related U.S. Application Data

(60) Provisional application No. 62/905,512, filed on Sep. 25, 2019.

(51) Int. Cl.
*H04W 4/00* (2018.01)
*H04L 1/00* (2006.01)
(Continued)

(52) U.S. Cl.
CPC ...... *H04L 1/0061* (2013.01); *H03M 13/2942* (2013.01); *H03M 13/3761* (2013.01); *H04L 5/0055* (2013.01)

(58) Field of Classification Search
CPC ... H04W 28/04; H04W 72/04; H04W 72/042; H04W 88/08; H04L 5/0007;
(Continued)

(56) References Cited

U.S. PATENT DOCUMENTS

| | | |
|---|---|---|
| 9,560,594 B2 | 1/2017 | Cho et al. |
| 10,554,265 B2 | 2/2020 | Venkatachalam Jayaraman et al. |

(Continued)

FOREIGN PATENT DOCUMENTS

| | | |
|---|---|---|
| CN | 1692578 A | 11/2005 |
| CN | 101156322 A | 4/2008 |

(Continued)

OTHER PUBLICATIONS

International Search Report and Written Opinion—PCT/US2020/052391—ISA/EPO—dated Dec. 14, 2020.

*Primary Examiner* — Phuongchau Ba Nguyen
(74) *Attorney, Agent, or Firm* — Kevin Donnelly

(57) ABSTRACT

This disclosure provides methods, devices and systems for acknowledgement and retransmission, and more specifically, to methods, devices and systems that enable a secondary wireless channel to provide acknowledgements of data transmitted on a primary wireless channel concurrently with the reception of additional data on the primary wireless channel. In some implementations, a transmitting device may transmit wireless packets including multiple codewords to a receiving device via a first wireless channel. The receiving device may attempt to decode the received codewords based on primary information in the codewords. The receiving device may then transmit to the transmitting device, via a second wireless channel, a codeword acknowledgement that identifies codewords that the receiving device did not successfully decode. The transmitting device may then transmit parity information to the receiving device via the first wireless channel that aids the receiving device in decoding the identified codewords.

26 Claims, 19 Drawing Sheets

(51) Int. Cl.
    *H03M 13/29*     (2006.01)
    *H03M 13/37*     (2006.01)
    *H04L 5/00*     (2006.01)

(58) Field of Classification Search
    CPC ... H04L 1/0061; H04L 5/0055; H04L 1/1819;
        H04L 1/0057; H04L 1/1861; H04L
        27/2602; H04L 1/1614; H04L 1/0041;
        H04L 1/0045; H04L 1/08; H04L 27/261;
        H03M 13/2942; H03M 13/3761; H03M
        13/6306; H03M 13/1102
    See application file for complete search history.

(56) References Cited

U.S. PATENT DOCUMENTS

| | | | |
|---|---|---|---|
| 11,265,119 B1 | 3/2022 | Zhang et al. | |
| 2007/0195731 A1 | 8/2007 | Camp, Jr. | |
| 2014/0153625 A1* | 6/2014 | Vojcic | G06F 11/1625 |
| | | | 375/340 |
| 2016/0242195 A1 | 8/2016 | Kwon et al. | |
| 2016/0277170 A1 | 9/2016 | Jia et al. | |
| 2016/0285589 A1* | 9/2016 | Mukkavilli | H04L 1/0045 |
| 2016/0330007 A1 | 11/2016 | Cherian et al. | |
| 2016/0380727 A1 | 12/2016 | Ryu et al. | |
| 2017/0127424 A1 | 5/2017 | Kherani et al. | |
| 2017/0164392 A1 | 6/2017 | Merlin et al. | |
| 2018/0167171 A1* | 6/2018 | Wu | H04L 1/1858 |
| 2018/0234880 A1 | 8/2018 | Jiang | H04L 1/1607 |
| 2018/0269899 A1* | 9/2018 | Noh | H03M 13/2906 |
| 2018/0375634 A1 | 12/2018 | Sun et al. | |
| 2019/0181986 A1* | 6/2019 | Kitamura | H04L 1/1819 |
| 2019/0349132 A1* | 11/2019 | Peyla | H04L 27/34 |
| 2020/0259600 A1* | 8/2020 | Cao | H04L 1/1819 |
| 2020/0305164 A1* | 9/2020 | Yang | H04W 4/00 |

FOREIGN PATENT DOCUMENTS

| | | | | |
|---|---|---|---|---|
| CN | 105745953 A | * | 7/2016 | ........... H04B 7/0452 |
| CN | 106717055 A | | 5/2017 | |
| WO | 02067429 A2 | | 8/2002 | |
| WO | 2010124238 A2 | | 10/2010 | |
| WO | 2012044863 A1 | | 4/2012 | |
| WO | WO-2018144560 A1 | * | 8/2018 | ............ H03M 13/09 |
| WO | WO-2018185637 A1 | * | 10/2018 | ............... H04L 1/08 |
| WO | WO-2019053631 A1 | * | 3/2019 | ........... H04L 1/0057 |

\* cited by examiner

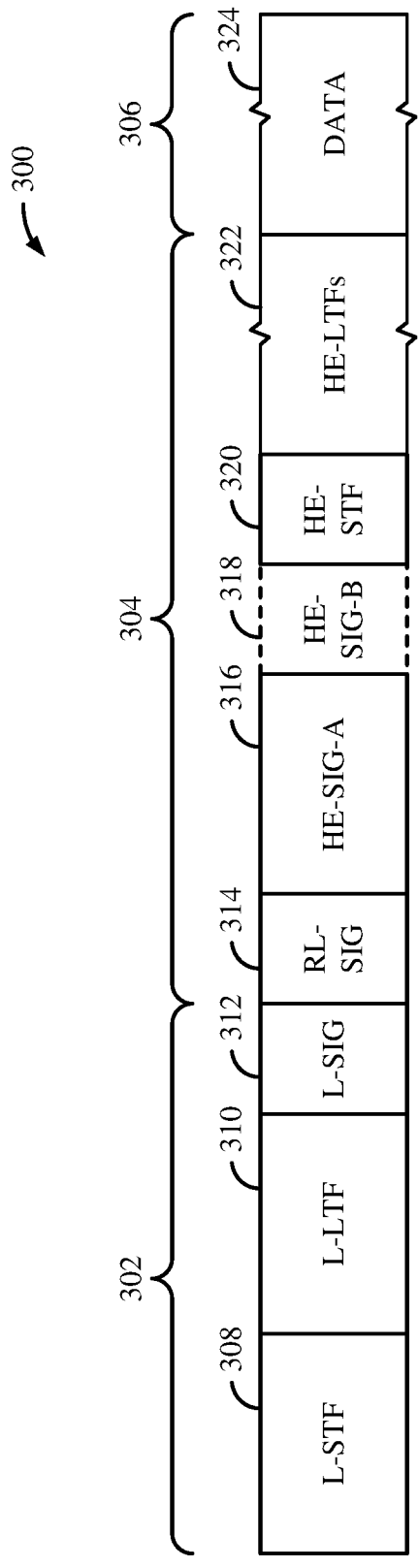
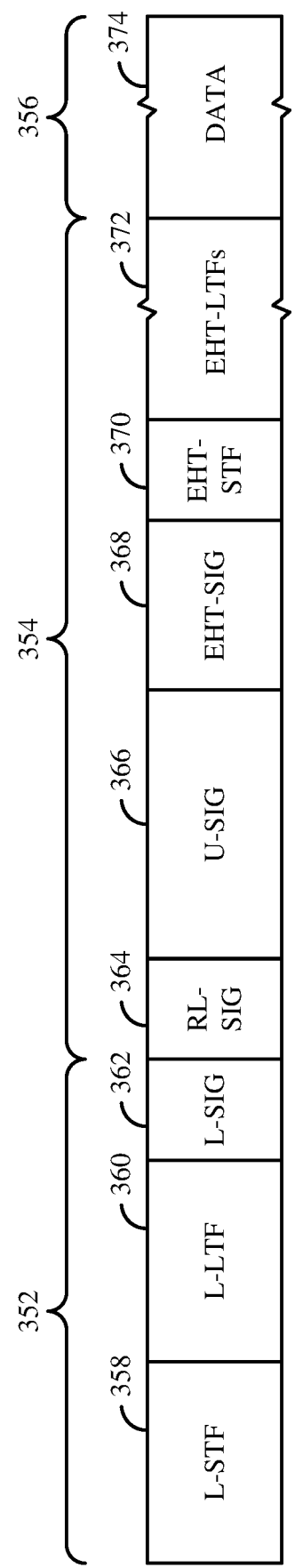
Figure 3A
Figure 3B

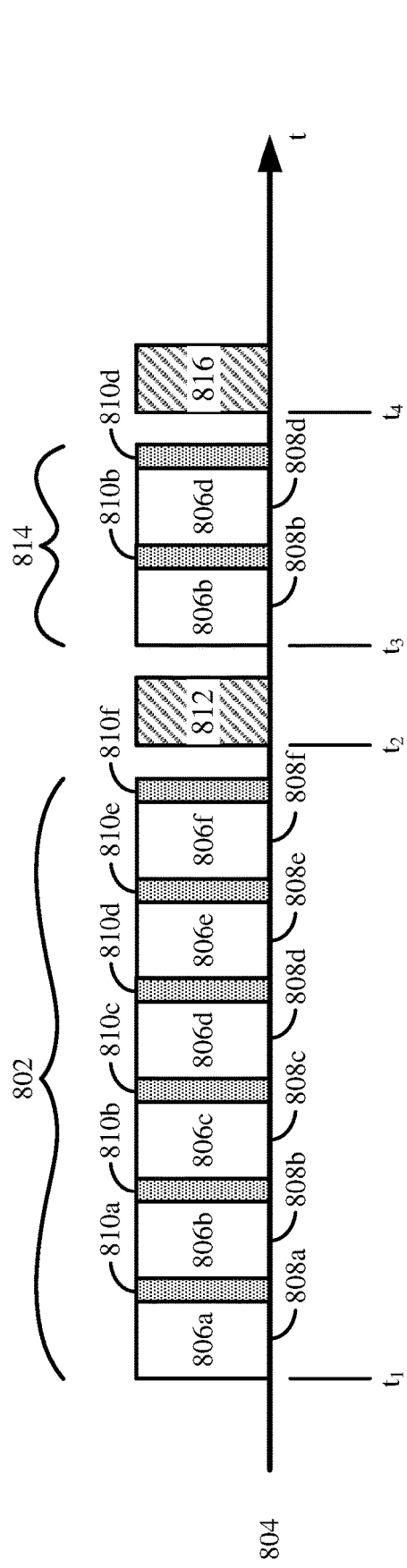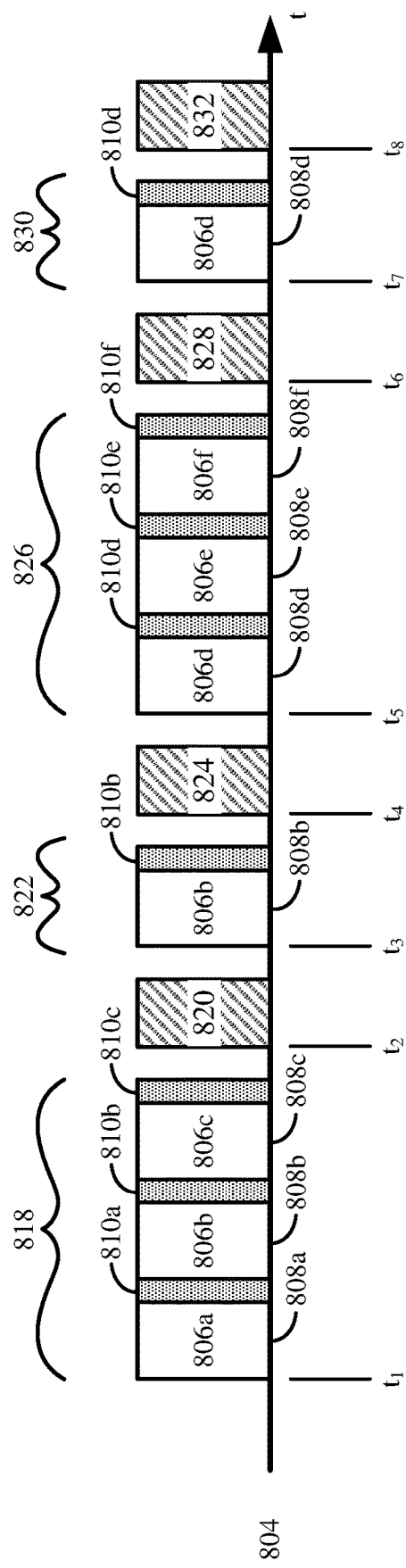
*Figure 8A*
*Figure 8B*

ACKNOWLEDGEMENT AND RETRANSMISSION TECHNIQUES UTILIZING SECONDARY WIRELESS CHANNEL

PRIORITY INFORMATION

The present application for patent claims priority under 35 U.S.C. § 119 to U.S. Provisional Patent Application No. 62/905,512, entitled "ACKNOWLEDGEMENT AND RETRANSMISSION TECHNIQUES UTILIZING SECONDARY WIRELESS CHANNEL," filed 25 Sep. 2019 and assigned to the assignee hereof, which is hereby expressly incorporated by reference herein.

TECHNICAL FIELD

This disclosure relates generally to wireless communication, and more specifically, to acknowledgement and retransmission techniques that enable a secondary wireless channel to provide acknowledgements of data transmitted on a primary wireless channel concurrently with the reception of additional data on the primary wireless channel.

DESCRIPTION OF THE RELATED TECHNOLOGY

A wireless local area network (WLAN) may be formed by one or more access points (APs) that provide a shared wireless communication medium for use by a number of client devices also referred to as stations (STAs). The basic building block of a WLAN conforming to the Institute of Electrical and Electronics Engineers (IEEE) 802.11 family of standards is a Basic Service Set (BSS), which is managed by an AP. Each BSS is identified by a Basic Service Set Identifier (BSSID) that is advertised by the AP. An AP periodically broadcasts beacon frames to enable any STAs within wireless range of the AP to establish or maintain a communication link with the WLAN.

Both transmitting and receiving devices have limited buffer capacities. As the length of a wireless packet increases, the transmitting and receiving devices need to devote more memory resources in their buffers for storing the data in the wireless packet. As such, there is a finite limit to the maximum length of any wireless packet that is based on the smaller of the transmit buffer size and the receive buffer size. As such, to reduce the memory resources necessary for acknowledgement and retransmission procedures, the number or sizes of the data units within a wireless packet may be reduced. However, as the length of a wireless packet is reduced, the temporal overhead associated with acknowledgement and retransmission procedures increases because more acknowledgements and wireless packets are required to successfully transmit and decode the same amount of data. As such, there is a tradeoff between reducing memory resources and reducing latency while increasing throughput.

The latest wireless communication protocols, including IEEE 802.11be, may support the use of high numbers of spatial streams over wide channel bandwidths carrying data modulated according to high order modulation schemes. Supporting data rates based on these techniques will require a significant amount of memory resources. As such, conventional techniques for acknowledgement and retransmission may require limiting the number of spatial streams, the channel bandwidth or the MCS.

SUMMARY

The systems, methods and devices of this disclosure each have several innovative aspects, no single one of which is solely responsible for the desirable attributes disclosed herein.

One innovative aspect of the subject matter described in this disclosure can be implemented in a method for wireless communication. The method includes generating a plurality of codewords, each codeword including respective primary information. The method also includes generating a first physical layer protocol data unit (PDU) including the plurality of codewords and transmitting, via a first wireless channel of a first wireless link to a second wireless communication device, the first PDU. The method additionally includes receiving, via a second wireless channel of a second wireless link from the second wireless communication device, a first codeword acknowledgement indicating, for each of one or more codewords or for each of one or more groups of a plurality of groups of codewords of the plurality of codewords, whether the respective codeword or the respective group of codewords was successfully decoded by the second wireless communication device. The method further includes transmitting, via the first wireless channel to the second wireless communication device, for each of one or more of the codewords indicated by the first codeword acknowledgement as not being successfully decoded, a respective instance of parity information based on the respective primary information. In some implementations, the first codeword acknowledgement may be received within a duration of the first PDU. In some such implementations, the respective instances of parity information may also be transmitted within the first PDU.

Another innovative aspect of the subject matter described in this disclosure can be implemented in a wireless communication device. The wireless communication device includes at least one modem, at least one processor communicatively coupled with the at least one modem, and at least one memory communicatively coupled with the at least one processor and storing processor-readable code that, when executed by the at least one processor in conjunction with the at least one modem, is configured to generate a plurality of codewords, each codeword including respective primary information. The code, processor and modem also are configured to generate a first PDU including the plurality of codewords and to transmit, via a first wireless channel of a first wireless link to a second wireless communication device, the first PDU. The code, processor and modem are additionally configured to receive, via a second wireless channel of a second wireless link from the second wireless communication device, a first codeword acknowledgement indicating, for each of one or more codewords or for each of one or more groups of a plurality of groups of codewords of the plurality of codewords, whether the respective codeword or the respective group of codewords was successfully decoded by the second wireless communication device. The code, processor and modem are further configured to transmit, via the first wireless channel to the second wireless communication device, for each of one or more of the codewords indicated by the first codeword acknowledgement as not being successfully decoded, a respective instance of parity information based on the respective primary information. In some implementations, the first codeword acknowledgement may be received within a duration of the first PDU. In some such implementations, the respective instances of parity information may also be transmitted within the first PDU.

Another innovative aspect of the subject matter described in this disclosure can be implemented in a method for wireless communication. The method includes receiving, via a first wireless channel of a first wireless link from a second wireless communication device, a first physical layer PDU including a plurality of codewords, each codeword including respective primary information. The method also includes performing a first decoding operation on the plurality of codewords. The method also includes determining whether the codewords of the plurality of codewords were successfully decoded. The method also includes transmitting, via a second wireless channel of a second wireless link to the second wireless communication device, a first codeword acknowledgement indicating, for each of one or more codewords or for each of one or more groups of a plurality of groups of codewords of the plurality of codewords, whether the respective codeword or the respective group of codewords was successfully decoded based on the determination. The method additionally includes receiving, via the first wireless channel from the second wireless communication device, for each of one or more of the codewords indicated by the first codeword acknowledgement as not being successfully decoded, a respective instance of parity information associated with the respective primary information. The method further includes performing a second decoding operation based on the respective instances of parity information. In some implementations, the first codeword acknowledgement may be transmitted within a duration of the first PDU. In some such implementations, the respective instances of parity information may also be received within the first PDU.

Another innovative aspect of the subject matter described in this disclosure can be implemented in a wireless communication device. The wireless communication device includes at least one modem, at least one processor communicatively coupled with the at least one modem, and at least one memory communicatively coupled with the at least one processor and storing processor-readable code that, when executed by the at least one processor in conjunction with the at least one modem, is configured to receive, via a first wireless channel of a first wireless link from a second wireless communication device, a first physical layer PDU including a plurality of codewords, each codeword including respective primary information. The code, processor and modem also are configured to perform a first decoding operation on the plurality of codewords. The code, processor and modem also are configured to determine whether the codewords of the plurality of codewords were successfully decoded. The code, processor and modem also are configured to transmit, via a second wireless channel of a second wireless link to the second wireless communication device, a first codeword acknowledgement indicating, for each of one or more codewords or for each of one or more groups of a plurality of groups of codewords of the plurality of codewords, whether the respective codeword or the respective group of codewords was successfully decoded based on the determination. The code, processor and modem are additionally configured to receive, via the first wireless channel from the second wireless communication device, for each of one or more of the codewords indicated by the first codeword acknowledgement as not being successfully decoded, a respective instance of parity information associated with the respective primary information. The code, processor and modem are further configured to perform a second decoding operation based on the respective instances of parity information. In some implementations, the first codeword acknowledgement may be transmitted within a duration of the first PDU. In some such implementations, the respective instances of parity information may also be received within the first PDU.

Another innovative aspect of the subject matter described in this disclosure can be implemented in a method for wireless communication. The method includes generating a plurality of medium access control (MAC) protocol data units (MPDUs). The method also includes generating a first physical layer PDU including the plurality of MPDUs. The method also includes transmitting, via a first wireless channel of a first wireless link to a second wireless communication device, the first PDU. The method additionally includes receiving, via a second wireless channel of a second wireless link from the second wireless communication device, a first acknowledgement indicating, for each of one or more MPDUs of the plurality of MPDUs, whether the respective MPDU was successfully decoded by the second wireless communication device. The method further includes retransmitting, via the first wireless channel to the second wireless communication device, each of one or more of the MPDUs indicated by the first acknowledgement as not being successfully decoded. In some implementations, the first acknowledgement may be received within a duration of the first PDU. In some such implementations, the retransmissions may also be transmitted within the first PDU.

Another innovative aspect of the subject matter described in this disclosure can be implemented in a wireless communication device. The wireless communication device includes at least one modem, at least one processor communicatively coupled with the at least one modem, and at least one memory communicatively coupled with the at least one processor and storing processor-readable code that, when executed by the at least one processor in conjunction with the at least one modem, is configured to generate a plurality of MPDUs. The code, processor and modem also are configured to generate a first PDU including the plurality of MPDUs. The code, processor and modem also are configured to transmit, via a first wireless channel of a first wireless link to a second wireless communication device, the first PDU. The code, processor and modem are additionally configured to receive, via a second wireless channel of a second wireless link from the second wireless communication device, a first acknowledgement indicating, for each of one or more MPDUs of the plurality of MPDUs, whether the respective MPDU was successfully decoded by the second wireless communication device. The code, processor and modem are further configured to retransmit, via the first wireless channel to the second wireless communication device, each of one or more of the MPDUs indicated by the first acknowledgement as not being successfully decoded. In some implementations, the first acknowledgement may be received within a duration of the first PDU. In some such implementations, the retransmissions may also be transmitted within the first PDU.

Another innovative aspect of the subject matter described in this disclosure can be implemented in a method for wireless communication. The method includes receiving, via a first wireless channel of a first wireless link from a second wireless communication device, a first physical layer PDU including a plurality of MPDUs. The method also includes performing a first decoding operation on the plurality of MPDUs. The method also includes determining whether the MPDUs of the plurality of MPDUs were successfully decoded. The method also includes transmitting, via a second wireless channel of a second wireless link to the second wireless communication device, a first acknowledgement indicating, for each of one or more MPDUs of the plurality of MPDUs, whether the respective MPDU was successfully decoded based on the determination. The method additionally includes receiving, via the first wireless channel from the second wireless communication device, for each of one or more of the MPDUs indicated by the first acknowledgement as not being successfully decoded, a retransmission of the MPDU. The method further includes performing a second decoding operation based on the retransmitted MPDU. In some implementations, the first acknowledgement may be transmitted within a duration of the first PDU. In some such implementations, the retransmissions may also be received within the first PDU.

Another innovative aspect of the subject matter described in this disclosure can be implemented in a wireless communication device. The wireless communication device includes at least one modem, at least one processor communicatively coupled with the at least one modem, and at least one memory communicatively coupled with the at least one processor and storing processor-readable code that, when executed by the at least one processor in conjunction with the at least one modem, is configured to receive, via a first wireless channel of a first wireless link from a second wireless communication device, a first physical layer PDU including a plurality of MPDUs. The code, processor and modem also are configured to perform a first decoding operation on the plurality of MPDUs. The code, processor and modem also are configured to determine whether the MPDUs of the plurality of MPDUs were successfully decoded. The code, processor and modem also are configured to transmit, via a second wireless channel of a second wireless link to the second wireless communication device, a first acknowledgement indicating, for each of one or more MPDUs of the plurality of MPDUs, whether the respective MPDU was successfully decoded based on the determination. The code, processor and modem are additionally configured to receive, via the first wireless channel from the second wireless communication device, for each of one or more of the MPDUs indicated by the first acknowledgement as not being successfully decoded, a retransmission of the MPDU. The code, processor and modem are further configured to perform a second decoding operation based on the retransmitted MPDU. In some implementations, the first acknowledgement may be transmitted within a duration of the first PDU. In some such implementations, the retransmissions may also be received within the first PDU.

BRIEF DESCRIPTION OF THE DRAWINGS

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

FIG. 3A shows another example PDU usable for communications between an AP and a number of STAs.

FIG. 3B shows another example PDU usable for communications between an AP and a number of STAs.

FIG. 8A shows a timing diagram illustrating (physical) PHY-layer acknowledgement and retransmission techniques.

FIG. 8B shows another timing diagram illustrating PHY-layer acknowledgement and retransmission techniques.

Like reference numbers and designations in the various drawings indicate like elements.

DETAILED DESCRIPTION

Figure 1:
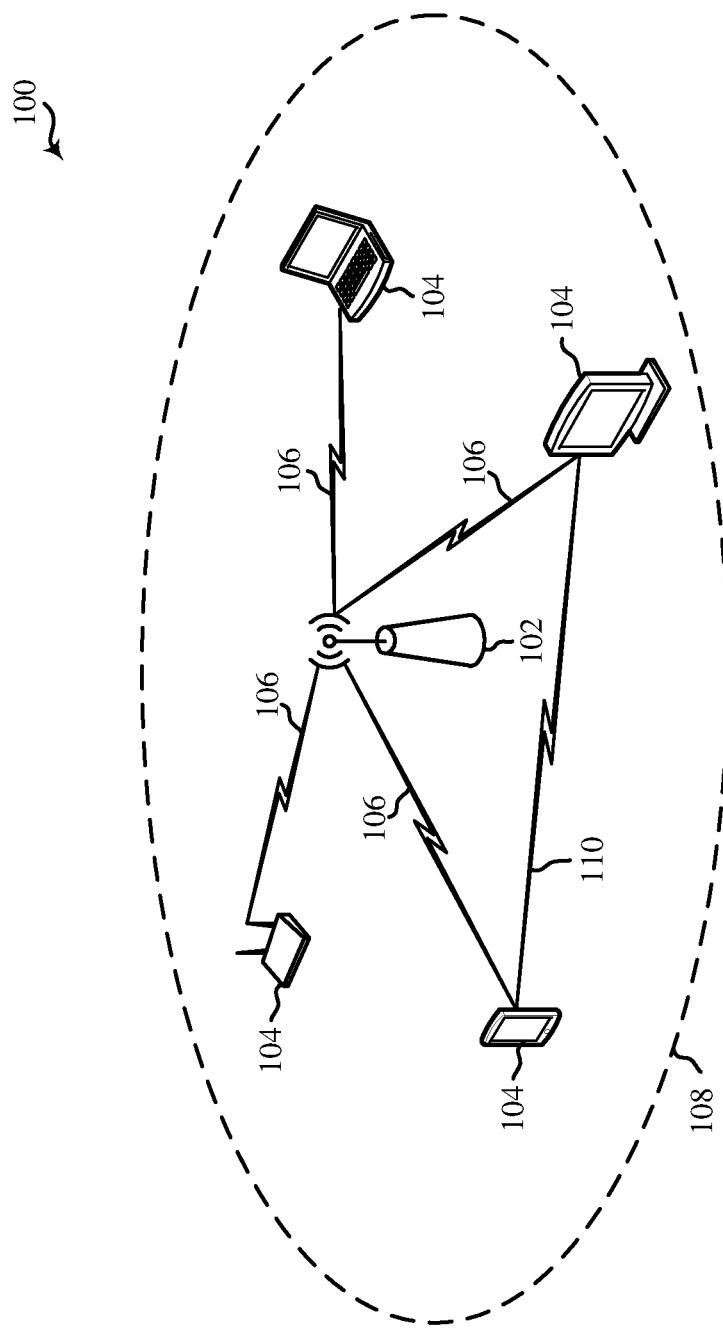
FIG. 1 shows a pictorial diagram of an example wireless communication network.

The following description is directed to some particular implementations for the purposes of describing innovative aspects of this disclosure. However, a person having ordinary skill in the art will readily recognize that the teachings herein can be applied in a multitude of different ways. The described implementations can be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the 3rd Generation Partnership Project (3GPP), among others. The described implementations can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), single-user (SU) multiple-input multiple-output (MIMO) and multi-user (MU) MIMO. The described implementations also can be implemented using other wireless communication protocols or RF signals suitable for use in one or more of a wireless personal area network (WPAN), a wireless local area network (WLAN), a wireless wide area network (WWAN), or an internet of things (IOT) network.

Various implementations relate generally to acknowledgement and retransmission techniques, and more specifically, to devices and methods that enable a secondary wireless channel to provide acknowledgements of data transmitted on a primary wireless channel concurrently with the reception of additional data on the primary wireless channel. In some implementations, a transmitting device may transmit wireless packets including multiple codewords to a receiving device via a first wireless channel. The receiving device may attempt to decode ones of the received codewords based on primary information in the codewords. The receiving device may then transmit to the transmitting device, via a second wireless channel, a codeword acknowledgement that identifies codewords that the receiving device did not successfully decode. The transmitting device may then transmit parity information to the receiving device via the first wireless channel that aids the receiving device in decoding the identified codewords.

Particular implementations of the subject matter described in this disclosure can be implemented to realize one or more of the following potential advantages. By enabling the receiving device to transmit a codeword acknowledgement on a second, different wireless channel, the transmitting device may continue its transmission of the wireless packet while receiving an acknowledgement for one or more first codewords transmitted in the wireless packet, thereby increasing efficiency and reducing latency associated with acknowledgement. This, in turn, enables the transmitting device to retransmit the unsuccessfully decoded codewords, or at least respective instances of parity information, in the same wireless packet in which the unsuccessfully decoded codewords were originally transmitted, thereby further reducing the latency associated with retransmission. In some implementations, the improvements in efficiency and latency may enable transmission at higher data rates for increased throughput using wireless packets having longer lengths while maintaining or reducing an amount of memory resources required for the transmission relative to those typically required for transmitting at lower data rates that employ conventional techniques.

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of wireless communication protocol standards (such as that defined by the IEEE 802.11-2016 specification or amendments thereof including, but not limited to, 802.11 ay, 802.11ax, 802.11az, 802.11ba and 802.11be). The WLAN 100 may include numerous wireless communication devices such as an access point (AP) 102 and multiple stations (STAs) 104. While only one AP 102 is shown, the WLAN network 100 also can include multiple APs 102.

Each of the STAs 104 also may be referred to as a mobile station (MS), a mobile device, a mobile handset, a wireless handset, an access terminal (AT), a user equipment (UE), a subscriber station (SS), or a subscriber unit, among other examples. The STAs 104 may represent various devices such as mobile phones, personal digital assistant (PDAs), other handheld devices, netbooks, notebook computers, tablet computers, laptops, display devices (for example, TVs, computer monitors, navigation systems, among others), music or other audio or stereo devices, remote control devices ("remotes"), printers, kitchen or other household appliances, key fobs (for example, for passive keyless entry and start (PKES) systems), among other examples.

A single AP 102 and an associated set of STAs 104 may be referred to as a basic service set (BSS), which is managed by the respective AP 102. FIG. 1 additionally shows an example coverage area 106 of the AP 102, which may represent a basic service area (BSA) of the WLAN 100. The BSS may be identified to users by a service set identifier (SSID), as well as to other devices by a basic service set identifier (BSSID), which may be a medium access control (MAC) address of the AP 102. The AP 102 periodically broadcasts beacon frames ("beacons") including the BSSID to enable any STAs 104 within wireless range of the AP 102 to "associate" or re-associate with the AP 102 to establish a respective communication link 108 (hereinafter also referred to as a "Wi-Fi link"), or to maintain a communication link 108, with the AP 102. For example, the beacons can include an identification of a primary channel used by the respective AP 102 as well as a timing synchronization function for establishing or maintaining timing synchronization with the AP 102. The AP 102 may provide access to external networks to various STAs 104 in the WLAN via respective communication links 108.

To establish a communication link 108 with an AP 102, each of the STAs 104 is configured to perform passive or active scanning operations ("scans") on frequency channels in one or more frequency bands (for example, the 2.4 GHz, 5 GHz, 6 GHz or 60 GHz bands). To perform passive scanning, a STA 104 listens for beacons, which are transmitted by respective APs 102 at a periodic time interval referred to as the target beacon transmission time (TBTT) (measured in time units (TUs) where one TU may be equal to 1024 microseconds (µs)). To perform active scanning, a STA 104 generates and sequentially transmits probe requests on each channel to be scanned and listens for probe responses from APs 102. Each STA 104 may be configured to identify or select an AP 102 with which to associate based on the scanning information obtained through the passive or active scans, and to perform authentication and association operations to establish a communication link 108 with the selected AP 102. The AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA or to select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may be configured to periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some cases, STAs 104 may form networks without APs 102 or other equipment other than the STAs 104 themselves. One example of such a network is an ad hoc network (or wireless ad hoc network). Ad hoc networks may alternatively be referred to as mesh networks or peer-to-peer (P2P) networks. In some cases, ad hoc networks may be implemented within a larger wireless network such as the WLAN 100. In such implementations, while the STAs 104 may be capable of communicating with each other through the AP 102 using communication links 108, STAs 104 also can communicate directly with each other via direct wireless links 110. Additionally, two STAs 104 may communicate via a direct communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless links 110 include Wi-Fi Direct connections, connections established by using a Wi-Fi Tunneled Direct Link Setup (TDLS) link, and other P2P group connections.

The APs 102 and STAs 104 may function and communicate (via the respective communication links 108) according to the IEEE 802.11 family of wireless communication protocol standards (such as that defined by the IEEE 802.11-2016 specification or amendments thereof including, but not limited to, 802.11 ay, 802.11ax, 802.11az, 802.11ba and 802.11be). These standards define the WLAN radio and baseband protocols for the PHY and medium access control (MAC) layers. The APs 102 and STAs 104 transmit and receive wireless communications (hereinafter also referred to as "Wi-Fi communications") to and from one another in the form of PHY protocol data units (PPDUs) (or physical layer convergence protocol (PLCP) PDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some implementations of the APs 102 and STAs 104 described herein also may communicate in other frequency bands, such as the 6 GHz band, which may support both licensed and unlicensed communications. The APs 102 and STAs 104 also can be configured to communicate over other frequency bands such as shared licensed frequency bands, where multiple operators may have a license to operate in the same or overlapping frequency band or bands.

Each of the frequency bands may include multiple subbands or frequency channels. For example, PPDUs conforming to the IEEE 802.11n, 802.11ac, 802.11ax and 802.11be standard amendments may be transmitted over the 2.4, 5 GHz or 6 GHz bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHz, 80 MHz, 160 or 320 MHz by bonding together multiple 20 MHz channels.

Each PPDU is a composite structure that includes a PHY preamble and a payload in the form of a PHY service data unit (PSDU). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is based on the particular IEEE 802.11 protocol to be used to transmit the payload.

Figure 2A:
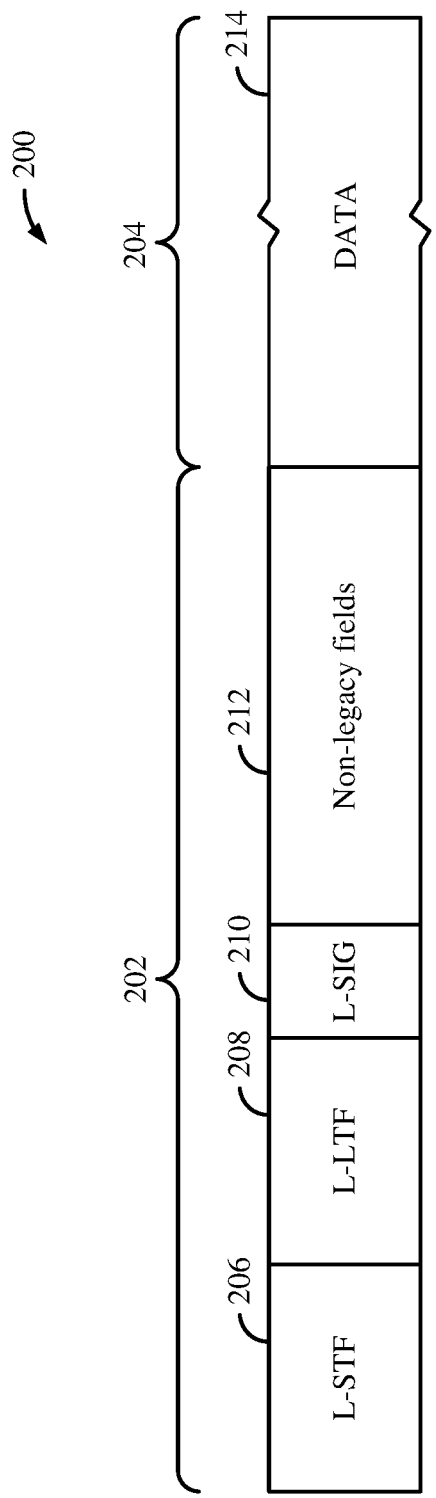
FIG. 2A shows an example protocol data unit (PDU) usable for communications between an access point (AP) and a number of stations (STAs).

FIG. 2A shows an example protocol data unit (PDU) 200 usable for wireless communication between an AP 102 and one or more STAs 104. For example, the PDU 200 can be configured as a PPDU. As shown, the PDU 200 includes a PHY preamble 202 and a PHY payload 204. For example, the preamble 202 may include a legacy portion that itself includes a legacy short training field (L-STF) 206, which may consist of two BPSK symbols, a legacy long training field (L-LTF) 208, which may consist of two BPSK symbols, and a legacy signal field (L-SIG) 210, which may consist of two BPSK symbols. The legacy portion of the preamble 202 may be configured according to the IEEE 802.11a wireless communication protocol standard. The preamble 202 may also include a non-legacy portion including one or more non-legacy fields 212, for example, conforming to an IEEE wireless communication protocol such as the IEEE 802.11ac, 802.11ax, 802.11be or later wireless communication protocol protocols.

The L-STF 206 generally enables a receiving device to perform coarse timing and frequency tracking and automatic gain control (AGC). The L-LTF 208 generally enables a receiving device to perform fine timing and frequency tracking and also to perform an initial estimate of the wireless channel. The L-SIG 210 generally enables a receiving device to determine a duration of the PDU and to use the determined duration to avoid transmitting on top of the PDU. For example, the L-STF 206, the L-LTF 208 and the L-SIG 210 may be modulated according to a binary phase shift keying (BPSK) modulation scheme. The payload 204 may be modulated according to a BPSK modulation scheme, a quadrature BPSK (Q-BPSK) modulation scheme, a quadrature amplitude modulation (QAM) modulation scheme, or another appropriate modulation scheme. The payload 204 may include a PSDU including a data field (DATA) 214 that, in turn, may carry higher layer data, for example, in the form of medium access control (MAC) protocol data units (MPDUs) or an aggregated MPDU (A-MPDU).

Figure 2B:
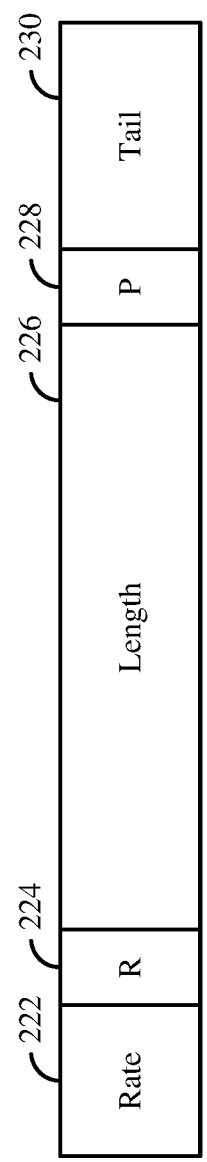
FIG. 2B shows an example field in the PDU of FIG. 2A.

FIG. 2B shows an example L-SIG 210 in the PDU 200 of FIG. 2A. The L-SIG 210 includes a data rate field 222, a reserved bit 224, a length field 226, a parity bit 228, and a tail field 230. The data rate field 222 indicates a data rate (note that the data rate indicated in the data rate field 212 may not be the actual data rate of the data carried in the payload 204). The length field 226 indicates a length of the packet in units of, for example, symbols or bytes. The parity bit 228 may be used to detect bit errors. The tail field 230 includes tail bits that may be used by the receiving device to terminate operation of a decoder (for example, a Viterbi decoder). The receiving device may utilize the data rate and the length indicated in the data rate field 222 and the length field 226 to determine a duration of the packet in units of, for example, microseconds (μs) or other time units.

FIG. 3A shows an example PPDU 300 usable for wireless communication between an AP and one or more STAs. The PPDU 300 may be used for SU, OFDMA or MU-MIMO transmissions. The PPDU 300 may be formatted as a High Efficiency (HE) WLAN PPDU in accordance with the IEEE 802.11ax amendment to the IEEE 802.11 wireless communication protocol standard. The PPDU 300 includes a PHY preamble including a legacy portion 302 and a non-legacy portion 304. The PPDU 300 may further include a PHY payload 306 after the preamble, for example, in the form of a PSDU including a data field 324.

The legacy portion 302 of the preamble includes an L-STF 308, an L-LTF 310, and an L-SIG 312. The non-legacy portion 304 includes a repetition of L-SIG (RL-SIG) 314, a first HE signal field (HE-SIG-A) 316, an HE short training field (HE-STF) 320, and one or more HE long training fields (or symbols) (HE-LTFs) 322. For OFDMA or MU-MIMO communications, the second portion 304 further includes a second HE signal field (HE-SIG-B) 318 encoded separately from HE-SIG-A 316. HE-STF 320 may be used for timing and frequency tracking and AGC, and HE-LTF 322 may be used for more refined channel estimation. Like the L-STF 308, L-LTF 310, and L-SIG 312, the information in RL-SIG 314 and HE-SIG-A 316 may be duplicated and transmitted in each of the component 20 MHz channels in instances involving the use of a bonded channel. In contrast, the content in HE-SIG-B 318 may be unique to each 20 MHz channel and target specific STAs 104.

RL-SIG 314 may indicate to HE-compatible STAs 104 that the PPDU 300 is an HE PPDU. An AP 102 may use HE-SIG-A 316 to identify and inform multiple STAs 104 that the AP has scheduled UL or DL resources for them. For example, HE-SIG-A 316 may include a resource allocation subfield that indicates resource allocations for the identified STAs 104. HE-SIG-A 316 may be decoded by each HE-compatible STA 104 served by the AP 102. For MU transmissions, HE-SIG-A 316 further includes information usable by each identified STA 104 to decode an associated HE-SIG-B 318. For example, HE-SIG-A 316 may indicate the frame format, including locations and lengths of HE-SIG-Bs 318, available channel bandwidths and modulation and coding schemes (MCSs), among other examples. HE-SIG-A 316 also may include HE WLAN signaling information usable by STAs 104 other than the identified STAs 104.

HE-SIG-B 318 may carry STA-specific scheduling information such as, for example, STA-specific (or "user-specific") MCS values and STA-specific RU allocation information. In the context of DL MU-OFDMA, such information enables the respective STAs 104 to identify and decode corresponding resource units (RUs) in the associated data field 324. Each HE-SIG-B 318 includes a common field and at least one STA-specific field. The common field can indicate RU allocations to multiple STAs 104 including RU assignments in the frequency domain, indicate which RUs are allocated for MU-MIMO transmissions and which RUs correspond to MU-OFDMA transmissions, and the number of users in allocations, among other examples. The common field may be encoded with common bits, CRC bits, and tail bits. The user-specific fields are assigned to particular STAs 104 and may be used to schedule specific RUs and to indicate the scheduling to other WLAN devices. Each user-specific field may include multiple user block fields. Each user block field may include two user fields that contain information for two respective STAs to decode their respective RU payloads in data field 324.

FIG. 3B shows another example PPDU 350 usable for wireless communication between an AP and one or more STAs. The PPDU 350 may be used for SU, OFDMA or MU-MIMO transmissions. The PPDU 350 may be formatted as an Extreme High Throughput (EHT) WLAN PPDU in accordance with the IEEE 802.11be amendment to the IEEE 802.11 wireless communication protocol standard, or may be formatted as a PPDU conforming to any later (post-EHT) version of a new wireless communication protocol conforming to a future IEEE 802.11 wireless communication protocol standard or other wireless communication standard. The PPDU 350 includes a PHY preamble including a legacy portion 352 and a non-legacy portion 354. The PPDU 350 may further include a PHY payload 356 after the preamble, for example, in the form of a PSDU including a data field 374.

The legacy portion 352 of the preamble includes an L-STF 358, an L-LTF 360, and an L-SIG 362. The non-legacy portion 354 of the preamble includes an RL-SIG 364 and multiple wireless communication protocol version-dependent signal fields after RL-SIG 364. For example, the non-legacy portion 354 may include a universal signal field 366 (referred to herein as "U-SIG 366") and an EHT signal field 368 (referred to herein as "EHT-SIG 368"). One or both of U-SIG 366 and EHT-SIG 368 may be structured as, and carry version-dependent information for, other wireless communication protocol versions beyond EHT. The non-legacy portion 354 further includes an additional short training field 370 (referred to herein as "EHT-STF 370," although it may be structured as, and carry version-dependent information for, other wireless communication protocol versions beyond EHT) and one or more additional long training fields 372 (referred to herein as "EHT-LTFs 372," although they may be structured as, and carry version-dependent information for, other wireless communication protocol versions beyond EHT). EHT-STF 370 may be used for timing and frequency tracking and AGC, and EHT-LTF 372 may be used for more refined channel estimation. Like L-STF 358, L-LTF 360, and L-SIG 362, the information in U-SIG 366 and EHT-SIG 368 may be duplicated and transmitted in each of the component 20 MHz channels in instances involving the use of a bonded channel. In some implementations, EHT-SIG 368 may additionally or alternatively carry information in one or more non-primary 20 MHz channels that is different than the information carried in the primary 20 MHz channel.

EHT-SIG 368 may include one or more jointly encoded symbols and may be encoded in a different block from the block in which U-SIG 366 is encoded. EHT-SIG 368 may be used by an AP to identify and inform multiple STAs 104 that the AP has scheduled UL or DL resources for them. EHT-SIG 368 may be decoded by each compatible STA 104 served by the AP 102. EHT-SIG 368 may generally be used by a receiving device to interpret bits in the data field 374. For example, EHT-SIG 368 may include RU allocation information, spatial stream configuration information, and per-user signaling information such as MCSs, among other examples. EHT-SIG 368 may further include a cyclic redundancy check (CRC) (for example, four bits) and a tail (for example, 6 bits) that may be used for binary convolutional code (BCC). In some implementations, EHT-SIG 368 may include one or more code blocks that each include a CRC and a tail. In some aspects, each of the code blocks may be encoded separately.

EHT-SIG 368 may carry STA-specific scheduling information such as, for example, user-specific MCS values and user-specific RU allocation information. EHT-SIG 368 may generally be used by a receiving device to interpret bits in the data field 374. In the context of DL MU-OFDMA, such information enables the respective STAs 104 to identify and decode corresponding RUs in the associated data field 374. Each EHT-SIG 368 may include a common field and at least one user-specific field. The common field can indicate RU distributions to multiple STAs 104, indicate the RU assignments in the frequency domain, indicate which RUs are allocated for MU-MIMO transmissions and which RUs correspond to MU-OFDMA transmissions, and the number of users in allocations, among other examples. The common field may be encoded with common bits, CRC bits, and tail bits. The user-specific fields are assigned to particular STAs 104 and may be used to schedule specific RUs and to indicate the scheduling to other WLAN devices. Each user-specific field may include multiple user block fields. Each user block field may include, for example, two user fields that contain information for two respective STAs to decode their respective RU payloads.

The presence of RL-SIG 364 and U-SIG 366 may indicate to EHT- or later version-compliant STAs 104 that the PPDU 350 is an EHT PPDU or a PPDU conforming to any later (post-EHT) version of a new wireless communication protocol conforming to a future IEEE 802.11 wireless communication protocol standard. For example, U-SIG 366 may be used by a receiving device to interpret bits in one or more of EHT-SIG 368 or the data field 374.

Figure 4:
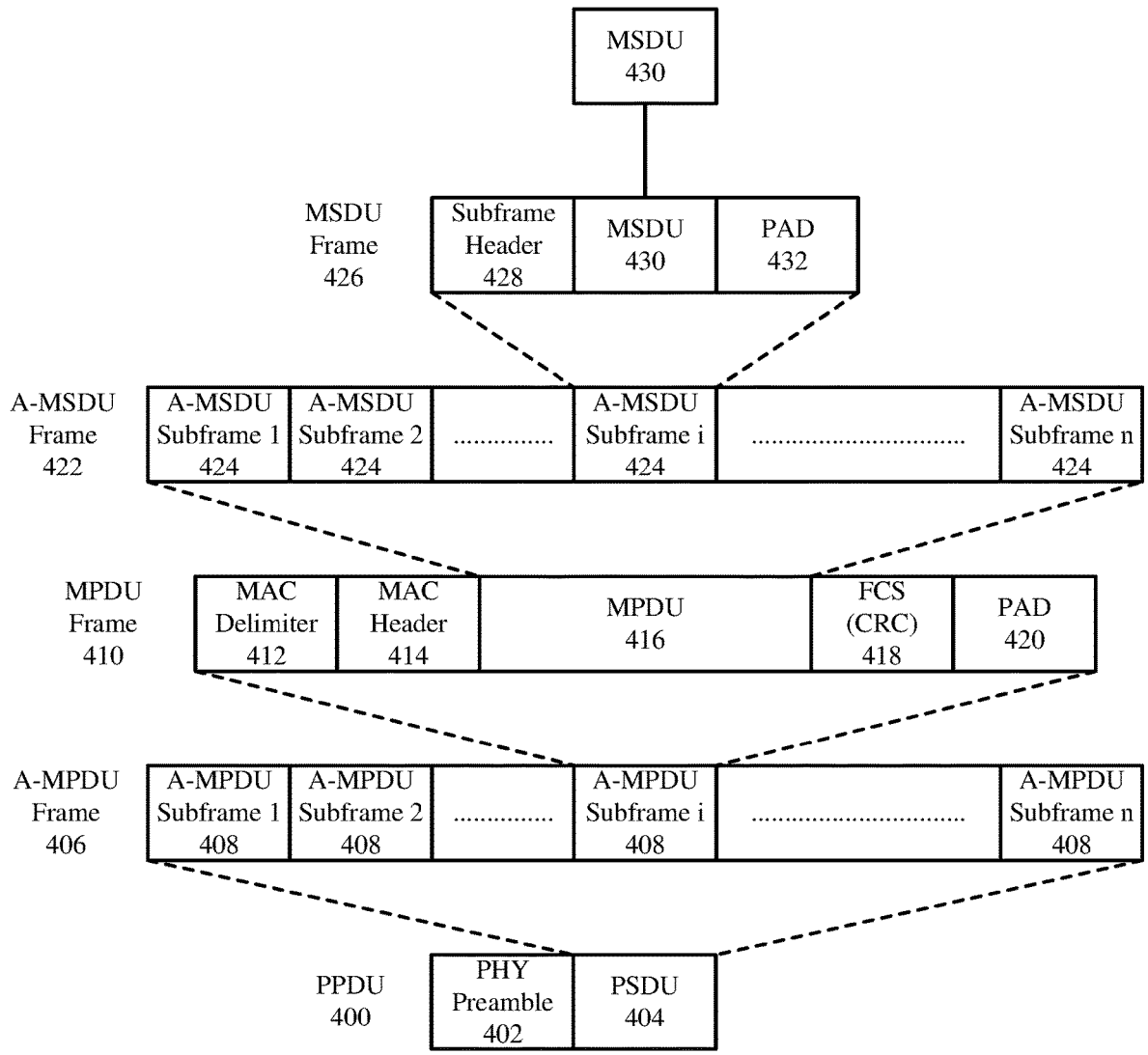
FIG. 4 shows an example physical layer convergence protocol (PLCP) protocol data unit (PPDU) usable for communications between an AP and a number of STAs.

FIG. 4 shows an example PPDU 400 usable for communications between an AP 102 and one or more STAs 104. As described above, each PPDU 400 includes a PHY preamble 402 and a PSDU 404. Each PSDU 404 may represent (or "carry") one or more MAC protocol data units (MPDUs) 416. For example, each PSDU 404 may carry an aggregated MPDU (A-MPDU) 406 that includes an aggregation of multiple A-MPDU subframes 408. Each A-MPDU subframe 406 may include an MPDU frame 410 that includes a MAC delimiter 412 and a MAC header 414 prior to the accompanying MPDU 416, which comprises the data portion ("payload" or "frame body") of the MPDU frame 410. Each MPDU frame 410 may also include a frame check sequence (FCS) field 418 for error detection (for example, the FCS field may include a cyclic redundancy check (CRC)) and padding bits 420. The MPDU 416 may carry one or more MAC service data units (MSDUs) 416. For example, the MPDU 416 may carry an aggregated MSDU (A-MSDU) 422 including multiple A-MSDU subframes 424. Each A-MSDU subframe 424 contains a corresponding MSDU 430 preceded by a subframe header 428 and in some cases followed by padding bits 432.

Referring back to the MPDU frame 410, the MAC delimiter 412 may serve as a marker of the start of the associated MPDU 416 and indicate the length of the associated MPDU 416. The MAC header 414 may include multiple fields containing information that defines or indicates characteristics or attributes of data encapsulated within the frame body 416. The MAC header 414 includes a duration field indicating a duration extending from the end of the PPDU until at least the end of an acknowledgment (ACK) or Block ACK (BA) of the PPDU that is to be transmitted by the receiving wireless communication device. The use of the duration field serves to reserve the wireless medium for the indicated duration, and enables the receiving device to establish its network allocation vector (NAV). The MAC header 414 also includes one or more fields indicating addresses for the data encapsulated within the frame body 416. For example, the MAC header 414 may include a combination of a source address, a transmitter address, a receiver address or a destination address. The MAC header 414 may further include a frame control field containing control information. The frame control field may specify a frame type, for example, a data frame, a control frame, or a management frame.

As described above, APs 102 and STAs 104 can support multi-user (MU) communications; that is, concurrent transmissions from one device to each of multiple devices (for example, multiple simultaneous downlink (DL) communications from an AP 102 to corresponding STAs 104), or concurrent transmissions from multiple devices to a single device (for example, multiple simultaneous uplink (UL) transmissions from corresponding STAs 104 to an AP 102). To support the MU transmissions, the APs 102 and STAs 104 may utilize multi-user multiple-input, multiple-output (MU-MIMO) and multi-user orthogonal frequency division multiple access (MU-OFDMA) techniques.

In MU-OFDMA schemes, the available frequency spectrum of the wireless channel may be divided into multiple resource units (RUs) each including multiple frequency subcarriers (also referred to as "tones"). Different RUs may be allocated or assigned by an AP 102 to different STAs 104 at particular times. The sizes and distributions of the RUs may be referred to as an RU allocation. In some implementations, RUs may be allocated in 2 MHz intervals, and as such, the smallest RU may include 26 tones consisting of 24 data tones and 2 pilot tones. Consequently, in a 20 MHz channel, up to 9 RUs (such as 2 MHz, 26-tone RUs) may be allocated (because some tones are reserved for other purposes). Similarly, in a 160 MHz channel, up to 74 RUs may be allocated. Larger 52 tone, 106 tone, 242 tone, 484 tone and 996 tone RUs may also be allocated. Adjacent RUs may be separated by a null subcarrier (such as a DC subcarrier), for example, to reduce interference between adjacent RUs, to reduce receiver DC offset, and to avoid transmit center frequency leakage.

For UL MU transmissions, an AP 102 can transmit a trigger frame to initiate and synchronize an UL MU-OFDMA or UL MU-MIMO transmission from multiple STAs 104 to the AP 102. Such trigger frames may thus enable multiple STAs 104 to send UL traffic to the AP 102 concurrently in time. A trigger frame may address one or more STAs 104 through respective association identifiers (AIDs), and may assign each AID (and thus each STA 104) one or more RUs that can be used to send UL traffic to the AP 102. The AP also may designate one or more random access (RA) RUs that unscheduled STAs 104 may contend for.

Figure 5:
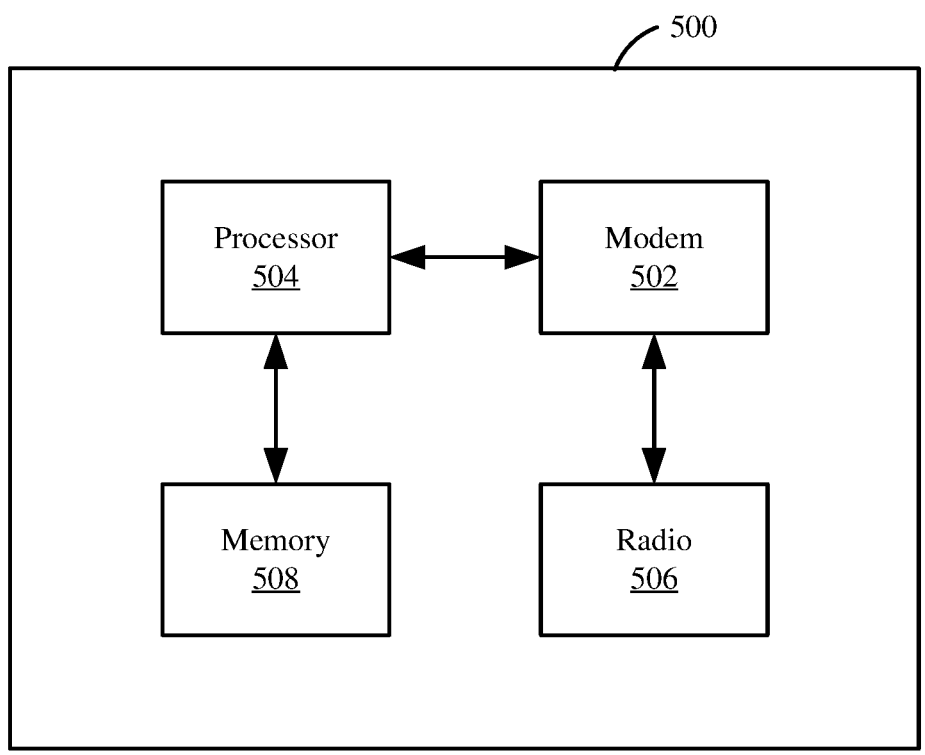
FIG. 5 shows a block diagram of an example wireless communication device.

FIG. 5 shows a block diagram of an example wireless communication device 500. In some implementations, the wireless communication device 500 can be an example of a device for use in a STA such as one of the STAs 104 described above with reference to FIG. 1. In some implementations, the wireless communication device 500 can be an example of a device for use in an AP such as the AP 102 described above with reference to FIG. 1. The wireless communication device 500 is capable of transmitting and receiving wireless communications in the form of, for example, wireless packets. For example, the wireless communication device can be configured to transmit and receive packets in the form of physical layer convergence protocol (PLCP) protocol data units (PPDUs) and medium access control (MAC) protocol data units (MPDUs) conforming to an IEEE 802.11 wireless communication protocol standard, such as that defined by the IEEE 802.11-2016 specification or amendments thereof including, but not limited to, 802.11ay, 802.11ax, 802.11az, 802.11ba and 802.11be.

The wireless communication device 500 can be, or can include, a chip, system on chip (SoC), chipset, package or device that includes one or more modems 502, for example, a Wi-Fi (IEEE 802.11 compliant) modem. In some implementations, the one or more modems 502 (collectively "the modem 502") additionally include a WWAN modem (for example, a 3GPP 4G LTE or 5G compliant modem). In some implementations, the wireless communication device 500 also includes one or more processors, processing blocks or processing elements 504 (collectively "the processor 504") coupled with the modem 502. In some implementations, the wireless communication device 500 additionally includes one or more radios 506 (collectively "the radio 506") coupled with the modem 502. In some implementations, the wireless communication device 500 further includes one or more memory blocks or elements 508 (collectively "the memory 508") coupled with the processor 504 or the modem 502.

The modem 502 can include an intelligent hardware block or device such as, for example, an application-specific integrated circuit (ASIC), among other examples. The modem 502 is generally configured to implement a PHY layer, and in some implementations, also a portion of a MAC layer (for example, a hardware portion of the MAC layer). For example, the modem 502 is configured to modulate packets and to output the modulated packets to the radio 506 for transmission over the wireless medium. The modem 502 is similarly configured to obtain modulated packets received by the radio 506 and to demodulate the packets to provide demodulated packets. In addition to a modulator and a demodulator, the modem 502 may further include digital signal processing (DSP) circuitry, automatic gain control (AGC) circuitry, a coder, a decoder, a multiplexer and a demultiplexer. For example, while in a transmission mode, data obtained from the processor 504 may be provided to an encoder, which encodes the data to provide coded bits. The coded bits may then be mapped to a number $N_{SS}$ of spatial streams for spatial multiplexing or a number $N_{STS}$ of space-time streams for space-time block coding (STBC). The coded bits in the streams may then be mapped to points in a modulation constellation (using a selected MCS) to provide modulated symbols. The modulated symbols in the respective spatial or space-time streams may be multiplexed, transformed via an inverse fast Fourier transform (IFFT) block, and subsequently provided to the DSP circuitry (for example, for Tx windowing and filtering). The digital signals may then be provided to a digital-to-analog converter (DAC). The resultant analog signals may then be provided to a frequency upconverter, and ultimately, the radio 506. In implementations involving beamforming, the modulated symbols in the respective spatial streams are precoded via a steering matrix prior to their provision to the IFFT block.

While in a reception mode, the DSP circuitry is configured to acquire a signal including modulated symbols received from the radio 506, for example, by detecting the presence of the signal and estimating the initial timing and frequency offsets. The DSP circuitry is further configured to digitally condition the signal, for example, using channel (narrowband) filtering and analog impairment conditioning (such as correcting for I/Q imbalance), and by applying digital gain to ultimately obtain a narrowband signal. The output of the DSP circuitry may then be fed to the AGC, which is configured to use information extracted from the digital signals, for example, in one or more received training fields, to determine an appropriate gain. The output of the DSP circuitry also is coupled with a demultiplexer that demultiplexes the modulated symbols when multiple spatial streams or space-time streams are received. The demultiplexed symbols may be provided to a demodulator, which is configured to extract the symbols from the signal and, for example, compute the logarithm likelihood ratios (LLRs) for each bit position of each subcarrier in each spatial stream. The demodulator is coupled with the decoder, which may be configured to process the LLRs to provide decoded bits. The decoded bits may then be descrambled and provided to the MAC layer (the processor 504) for processing, evaluation or interpretation.

The radio 506 generally includes at least one radio frequency (RF) transmitter (or "transmitter chain") and at least one RF receiver (or "receiver chain"), which may be combined into one or more transceivers. For example, each of the RF transmitters and receivers may include various analog circuitry including at least one power amplifier (PA) and at least one low-noise amplifier (LNA), respectively. The RF transmitters and receivers may, in turn, be coupled to one or more antennas. For example, in some implementations, the wireless communication device 500 can include, or be coupled with, multiple transmit antennas (each with a corresponding transmit chain) and multiple receive antennas (each with a corresponding receive chain). The symbols output from the modem 502 are provided to the radio 506, which then transmits the symbols via the coupled antennas. Similarly, symbols received via the antennas are obtained by the radio 506, which then provides the symbols to the modem 502.

The processor 504 can include an intelligent hardware block or device such as, for example, a processing core, a processing block, a central processing unit (CPU), a microprocessor, a microcontroller, a digital signal processor (DSP), an application-specific integrated circuit (ASIC), a programmable logic device (PLD) such as a field programmable gate array (FPGA), discrete gate or transistor logic, discrete hardware components, or any combination thereof designed to perform the functions described herein. The processor 504 processes information received through the radio 506 and the modem 502, and processes information to be output through the modem 502 and the radio 506 for transmission through the wireless medium. For example, the processor 504 may implement a control plane and at least a portion of a MAC layer configured to perform various operations related to the generation, transmission, reception and processing of MPDUs, frames or packets. In some implementations, the MAC layer is configured to generate MPDUs for provision to the PHY layer for coding, and to receive decoded information bits from the PHY layer for processing as MPDUs. The MAC layer may further be configured to allocate time and frequency resources, for example, for OFDMA, among other operations or techniques. In some implementations, the processor 504 may generally control the modem 502 to cause the modem to perform various operations described above.

The memory 508 can include tangible storage media such as random-access memory (RAM) or read-only memory (ROM), or combinations thereof. The memory 508 also can store non-transitory processor- or computer-executable software (SW) code containing instructions that, when executed by the processor 504, cause the processor to perform various operations described herein for wireless communication, including the generation, transmission, reception and interpretation of MPDUs, frames or packets. For example, various functions of components disclosed herein, or various blocks or steps of a method, operation, process or algorithm disclosed herein, can be implemented as one or more modules of one or more computer programs.

Figure 6B:
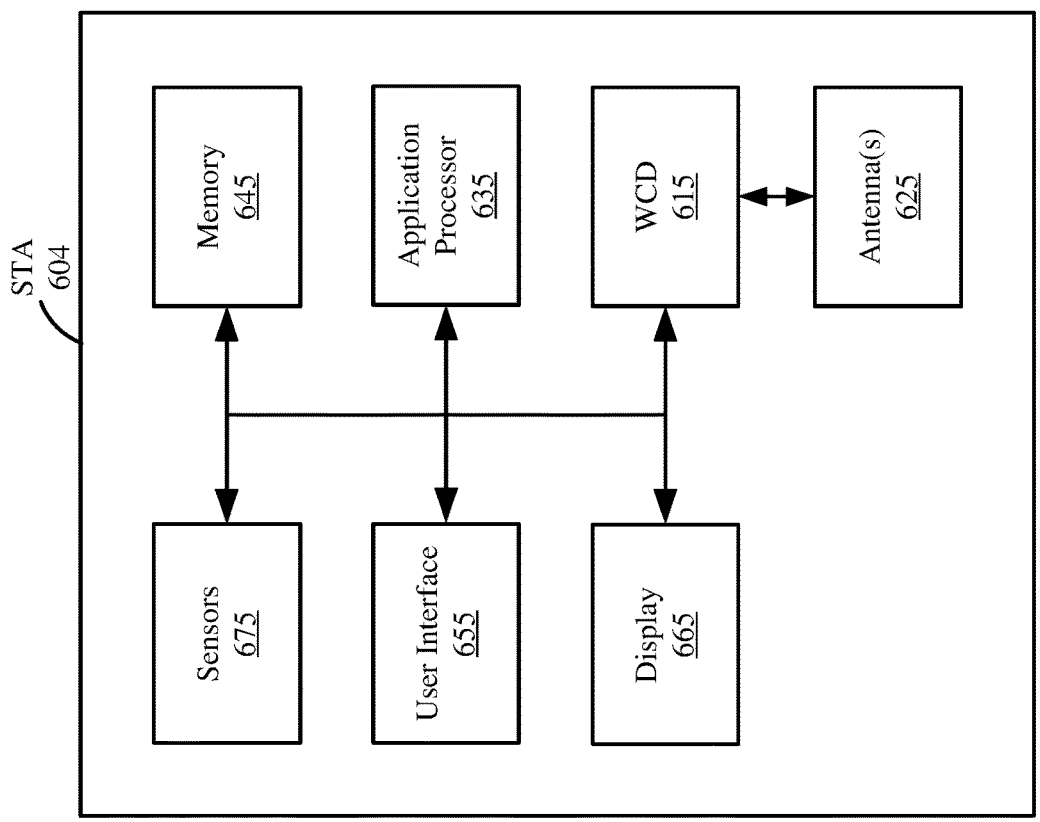
FIG. 6B shows a block diagram of an example station (STA).
Figure 6A:
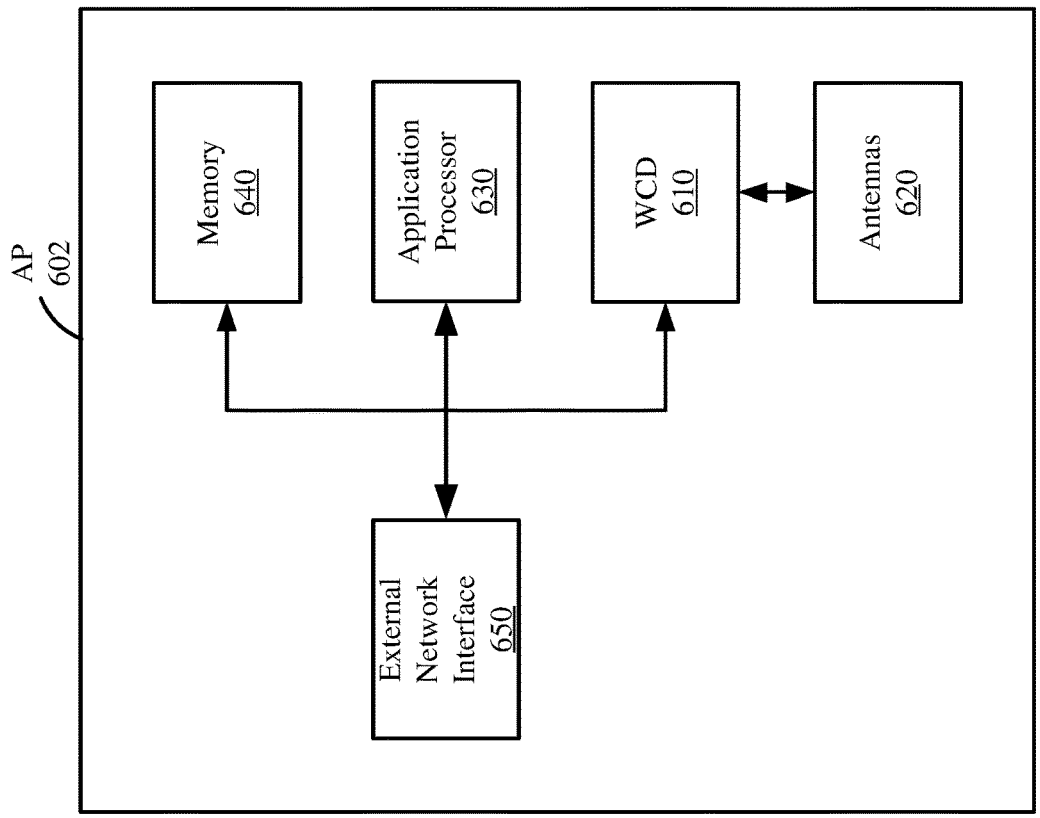
FIG. 6A shows a block diagram of an example access point (AP).

FIG. 6A shows a block diagram of an example AP 602. For example, the AP 602 can be an example implementation of the AP 102 described with reference to FIG. 1. The AP 602 includes a wireless communication device (WCD) 610 (although the AP 602 may itself also be referred to generally as a wireless communication device as used herein). For example, the wireless communication device 610 may be an example implementation of the wireless communication device 5000 described with reference to FIG. 5. The AP 602 also includes multiple antennas 620 coupled with the wireless communication device 610 to transmit and receive wireless communications. In some implementations, the AP 602 additionally includes an application processor 630 coupled with the wireless communication device 610, and a memory 640 coupled with the application processor 630. The AP 602 further includes at least one external network interface 650 that enables the AP 602 to communicate with a core network or backhaul network to gain access to external networks including the Internet. For example, the external network interface 650 may include one or both of a wired (for example, Ethernet) network interface and a wireless network interface (such as a WWAN interface). Ones of the aforementioned components can communicate with other ones of the components directly or indirectly, over at least one bus. The AP 602 further includes a housing that encompasses the wireless communication device 610, the application processor 630, the memory 640, and at least portions of the antennas 620 and external network interface 650.

FIG. 6B shows a block diagram of an example STA 604. For example, the STA 604 can be an example implementation of the STA 104 described with reference to FIG. 1. The STA 604 includes a wireless communication device 615 (although the STA 604 may itself also be referred to generally as a wireless communication device as used herein). For example, the wireless communication device 615 may be an example implementation of the wireless communication device 500 described with reference to FIG. 5. The STA 604 also includes one or more antennas 625 coupled with the wireless communication device 615 to transmit and receive wireless communications. The STA 604 additionally includes an application processor 635 coupled with the wireless communication device 615, and a memory 645 coupled with the application processor 635. In some implementations, the STA 604 further includes a user interface (UI) 655 (such as a touchscreen or keypad) and a display 665, which may be integrated with the UI 655 to form a touchscreen display. In some implementations, the STA 604 may further include one or more sensors 675 such as, for example, one or more inertial sensors, accelerometers, temperature sensors, pressure sensors, or altitude sensors. Ones of the aforementioned components can communicate with other ones of the components directly or indirectly, over at least one bus. The STA 604 further includes a housing that encompasses the wireless communication device 615, the application processor 635, the memory 645, and at least portions of the antennas 625, UI 655, and display 665.

Figure 7A:
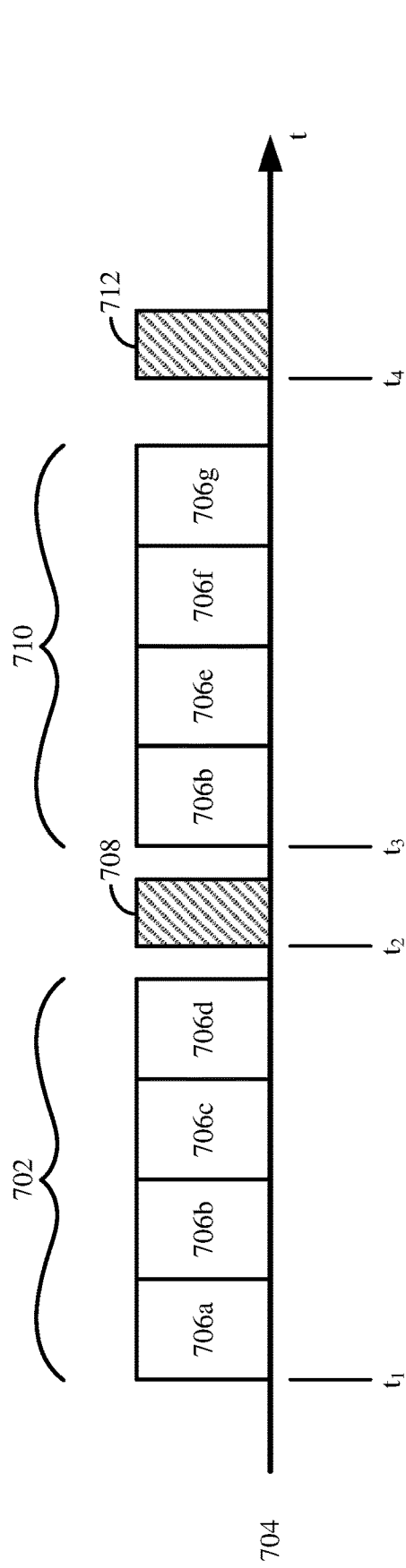
FIG. 7A shows a timing diagram illustrating medium access control (MAC)-layer acknowledgement and retransmission techniques.

FIG. 7A shows a timing diagram illustrating MAC-layer acknowledgement and retransmission techniques. As shown, a first wireless communication device (a "transmitting device") transmits a first wireless packet 702 at time $t_1$ to a second wireless communication device (a "receiving device") via a wireless channel 704. For didactic purposes, FIG. 7A illustrates an example in which the first wireless packet 702 includes an A-MPDU comprising four MPDUs 706a, 706b, 706c and 706d; however, the A-MPDU may include any number of MPDUs, for example, within an associated sequence number limit.

The receiving device may receive the wireless packet 702 and attempt to decode the MPDUs within it. The receiving device may then transmit an acknowledgement of each MPDU it decoded successfully. For example, the receiving device may transmit a block acknowledgement (ACK) 708 at time $t_2$ that serves to acknowledge the reception of those MPDUs that were successfully decoded. For example, the block ACK 708 may include a bitmap in which a value of each bit indicates whether a respective one of the MPDUs was successfully decoded. The transmitting device may then retransmit those MPDUs that were not successfully decoded.

In some instances, the MPDUs to be retransmitted are aggregated with new MPDUs to be transmitted in a single subsequent packet. In the example illustrated in FIG. 7A, the block ACK 708 indicates that the MPDU 706b was not successfully decoded. The transmitting device transmits a second wireless packet 710 to the receiving device at time $t_3$ that again includes the MPDU 706b but that also includes new MPDUs 706e, 706f and 706g. As similarly described with respect to the first wireless packet 702, the receiving device may receive the second wireless packet 710 and attempt to decode the MPDUs within it. The receiving device may then transmit a block ACK 712 at time $t_4$ that serves to acknowledge the reception of those MPDUs that were successfully decoded.

In some examples, one or both of the transmitting and receiving devices may have a limited buffer capacity. As the number or sizes of the MPDUs aggregated in a single wireless packet increases, the transmitting and receiving devices need to devote more memory resources in their buffers for storing the MPDUs. As such, there is a finite limit to the maximum length of any wireless packet that is based on the smaller of the transmit buffer size and the receive buffer size. As such, to reduce the memory resources necessary for acknowledgement and retransmission procedures, the number or sizes of the MPDUs aggregated in a single packet may be reduced. However, as the number or sizes of the MPDUs aggregated in a single packet is reduced, the temporal overhead associated with the acknowledgement and retransmission procedures increases because more acknowledgements (for example, block ACKs) and wireless packets are required to successfully transmit and decode the same amount of data. As such, there is a tradeoff between reducing memory resources and reducing latency while increasing throughput.

Figure 7B:
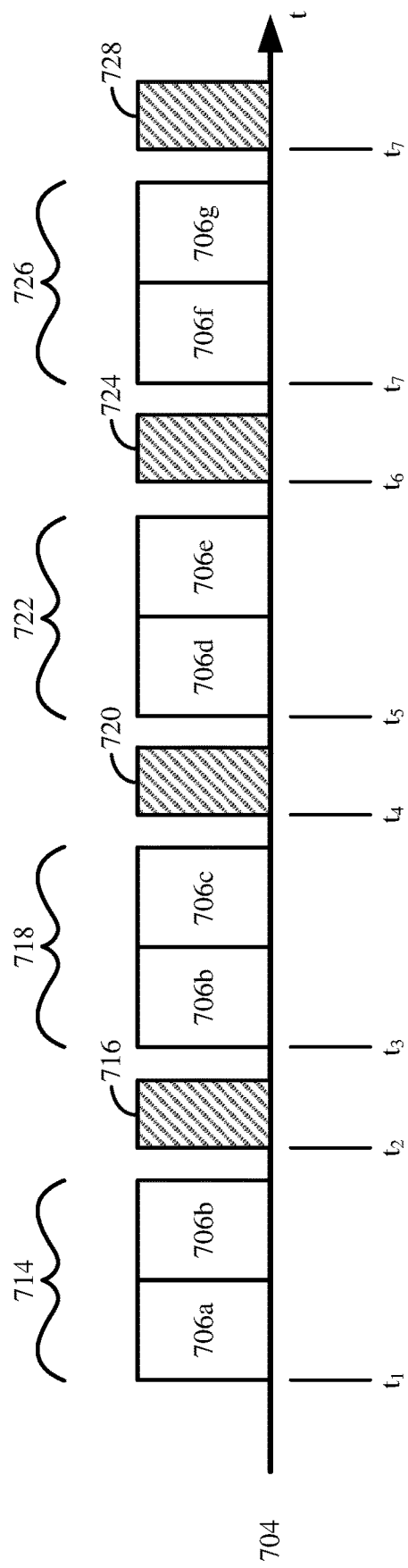
FIG. 7B shows another timing diagram illustrating MAC-layer acknowledgement and retransmission techniques.

FIG. 7B shows another timing diagram illustrating MAC-layer acknowledgement and retransmission techniques. A transmitting device transmits a sequence of wireless packets. Relative to the wireless packets 702 and 710 shown and described with reference to FIG. 7A, the lengths of the wireless packets 714, 718, 722 and 726 of FIG. 7B are considerably shorter. As shown in this didactic example, assuming again that the MPDU 706b requires retransmission, twice as many block ACKs (including block ACKs 716, 720, 724 and 728) and wireless packets (including wireless packets 714, 718, 722 and 726) are required to enable the receiving device to successfully decode the same amount of data. In such a case, the reduction in memory resources may be outweighed by the increase in latency and reduction in throughput.

FIG. 8A shows a timing diagram illustrating PHY-layer acknowledgement and retransmission techniques. As shown, a first wireless communication device (a "transmitting device") transmits a first wireless packet 802 at time $t_1$ to a second wireless communication device (a "receiving device") via a wireless channel 804. For didactic purposes, FIG. 8A illustrates an example in which the first wireless packet 802 includes a PSDU comprising six codewords 806a, 806b, 806c, 806d, 806e and 806f; however, the PSDU may include any number of codewords, for example, within the limit imposed by the associated TXOP. Each codeword includes respective primary (also referred to as "systematic") information and respective parity information based on the primary information. For example, the codewords 806a, 806b, 806c, 806d, 806e and 806f may include systematic portions 808a, 808b, 808c, 808d, 808e and 808f, respectively, that include the primary information, and parity portions 810a, 810b, 810c, 810d, 810e and 810f, respectively, that include the parity information.

The receiving device may receive the wireless packet 802 and attempt to decode the codewords within it based on the primary information and the parity information. The receiving device may then transmit, for each of the codewords, an acknowledgement if the codeword was decoded successfully, or a negative acknowledgement if the codeword was not decoded successfully. For example, the receiving device may transmit a codeword acknowledgement (or "codeword block acknowledgement") 812 at time $t_2$. The codeword acknowledgement 812 may include a bitmap in which a binary value of each bit indicates whether a respective one of the codewords was successfully decoded or not successfully decoded. Alternatively, as another example, the codeword acknowledgement 812 may include a bitmap in which a binary value of each bit indicates whether a respective group of codewords (for example, a group of 2, 4, 8 or more codewords depending on the data rate and memory requirements) was successfully decoded or not successfully decoded. The transmitting device may then retransmit those codewords that were not successfully decoded.

In some instances, the transmitting device may retransmit the unsuccessfully decoded codewords or codeword groups in a wireless packet or transmission having a payload that contains only the retransmitted codewords. For didactic purposes, FIG. 8A illustrates an example in which the codeword acknowledgement 812 indicated that codewords 806b and 806d were not successfully decoded. As also shown in FIG. 8A, the transmitting device transmits a second wireless packet 814 that includes retransmissions of the previously unsuccessfully decoded codewords 806b and 806d. Based on the retransmissions of the unsuccessfully decoded codewords alone or in combination with the previous transmissions of the unsuccessfully decoded codewords, the receiving device is able to successfully decode the codewords 806b and 806d. The receiving device then transmits a codeword acknowledgement 816 at time $t_4$ indicating that the codewords 806b and 806d were successfully decoded.

Both the transmitting and receiving devices have limited buffer capacities. As the number or sizes of the codewords in a single wireless packet increases, the transmitting and receiving devices need to allocate more memory resources in their buffers for storing the codewords. Conventionally, a receiving device may not forward a PSDU to the MAC layer or deallocate memory resources for the codewords in the PSDU until all of the codewords in the entire PSDU have been successfully decoded. Similarly, a transmitting device doesn't deallocate memory resources for the codewords in the PSDU until it receives acknowledgements indicating that all of the codewords in the entire PSDU have been successfully decoded by the receiving device.

There is a finite limit to the maximum length of any wireless packet that is based on the smaller of the transmit buffer size and the receive buffer size. As such, to reduce the memory resources necessary for acknowledgement and retransmission procedures, the number or sizes of the codewords aggregated in a single packet may be reduced. However, as the number or sizes of the codewords aggregated in a single packet is reduced, the temporal overhead associated with the acknowledgement and retransmissions procedures increases because more codeword acknowledgements and wireless packets are required to successfully transmit and decode the same amount of data. As such, there is a tradeoff between reducing memory resources and reducing latency while increasing throughput.

FIG. 8B shows another timing diagram illustrating PHY-layer acknowledgement and retransmission techniques. A transmitting device transmits a sequence of wireless packets. Relative to the wireless packets 802 and 814 shown and described with reference to FIG. 8A, the lengths of the wireless packets 818, 822, 826 and 830 of FIG. 8B are considerably shorter. As shown in this didactic example, assuming again that the codewords 806b and 806d require retransmission, twice as many codeword acknowledgements (including codeword acknowledgements 820, 824, 828 and 832) and wireless packets (including wireless packets 816, 820, 824 and 828) are required to enable the receiving device to successfully decode the same amount of data. In such a case, the reduction in memory resources may be outweighed by the increase in latency and reduction in throughput.

The latest wireless communication protocols, including IEEE 802.11be, may support the use of 16 spatial streams over a 320 MHz channel bandwidth carrying data modulated according to a 4k QAM modulation scheme. Supporting data rates based on these techniques will require a significant amount of memory resources. As such, conventional techniques for acknowledgement and retransmission may require limiting the number of spatial streams, the channel bandwidth or the MCS. Additionally or alternatively, the lengths of the PSDUs may be shortened but, as described above, this typically introduces latency.

Various implementations relate generally to acknowledgement and retransmission techniques, and more specifically, to devices and methods that enable a secondary wireless channel to provide acknowledgements of data transmitted on a primary wireless channel concurrently with the reception of additional data on the primary wireless channel. In some implementations, a transmitting device may transmit wireless packets including multiple codewords to a receiving device via a first wireless channel. The receiving device may attempt to decode ones of the received codewords based on primary information in the codewords. The receiving device may then transmit to the transmitting device, via a second wireless channel, a codeword acknowledgement that identifies codewords that the receiving device did not successfully decode. The transmitting device may then transmit parity information to the receiving device via the first wireless channel that aids the receiving device in decoding the identified codewords.

Particular implementations of the subject matter described in this disclosure can be implemented to realize one or more of the following potential advantages. By enabling the receiving device to transmit a codeword acknowledgement on a second, different wireless channel, the transmitting device may continue its transmission of the wireless packet while receiving an acknowledgement for one or more first codewords transmitted in the wireless packet, thereby increasing efficiency and reducing latency associated with acknowledgement. This, in turn, enables the transmitting device to retransmit the unsuccessfully decoded codewords, or at least respective instances of parity information, in the same wireless packet in which the unsuccessfully decoded codewords were originally transmitted, thereby further reducing the latency associated with retransmission. In some implementations, the improvements in efficiency and latency may enable transmission at higher data rates for increased throughput using wireless packets having longer lengths while maintaining or reducing an amount of memory resources required for the transmission relative to those typically required for transmitting at lower data rates that employ conventional techniques.

Figure 9:
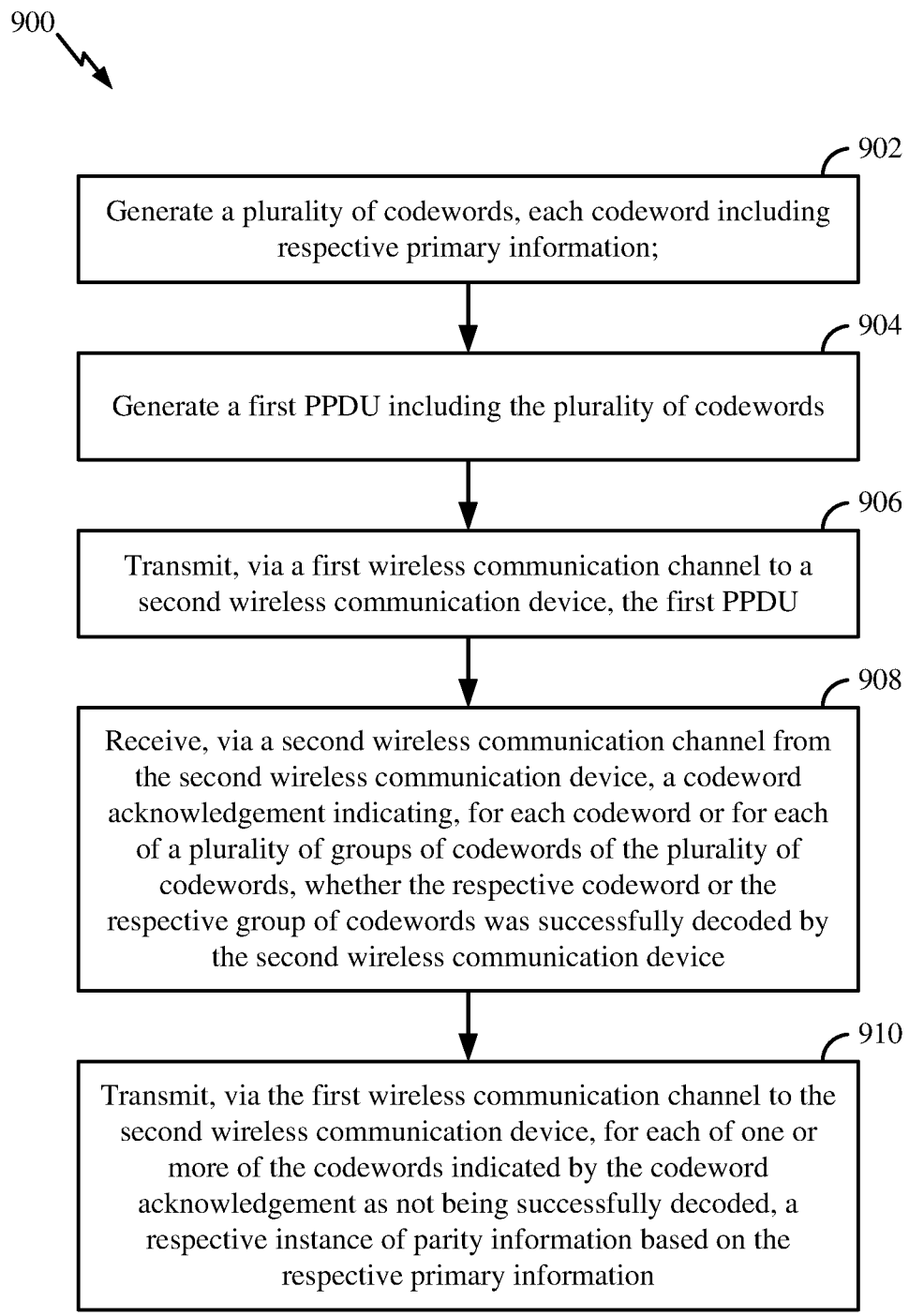
FIG. 9 shows a flowchart illustrating an example process for wireless communication that supports acknowledgement and retransmission techniques according to some implementations.

FIG. 9 shows a flowchart illustrating an example process 900 for wireless communication that supports acknowledgement and retransmission techniques according to some implementations. The operations of the process 900 may be implemented by a transmitting device, such as an AP or a STA, or components thereof, as described herein. For example, the process 900 may be performed by a wireless communication device such as the wireless communication device 500 described above with reference to FIG. 5. In some implementations, the process 900 may be performed by an AP, such as one of the APs 102 and 602 described above with reference to FIGS. 1 and 6A, respectively. In some implementations, the process 900 may be performed by a STA, such as one of the STAs 104 and 604 described above with reference to FIGS. 1 and 6B, respectively.

In some implementations, the transmitting device is configured for dual band simultaneous communication. For example, the transmitting device may include a first radio for communicating with a receiving device via a first wireless link in a first band, and may include a second radio for communicating with the receiving device via a second wireless link in a different subband of the first band or in a second band. In some implementations, the transmitting device is further configured for multilink aggregation. For example, the transmitting device may be configured to aggregate the first and the second wireless links to enable simultaneous transmission to, and reception from, the receiving device.

In block 902, the transmitting device generates multiple codewords, each codeword including respective primary information. For example, a PHY layer of the transmitting device may receive bits for an A-MPDU that includes multiple MPDUs from a MAC layer of the transmitting device in the form of a PSDU, divide the bits in the PSDU into one or more code blocks, and allocate memory resources for processing the code blocks. Each code block is stored in the allocated memory resources and includes a systematic portion that contains primary information (or "systematic information") representative of some or all of one or more of the MPDUs in the form of bits. In some implementations, the code blocks are provided to a low density parity check (LDPC) encoder that encodes the code blocks to generate multiple respective codewords. The LDPC encoder is an example of a systematic encoder that adds redundancy to the input data without changing the data itself. LDPC encoding is an example of forward error correction (FEC) coding. In some implementations, on a per-code-block basis, the LDPC encoder receives a code block including primary information and generates parity information based on the primary information. The parity information may then be stored with the respective primary information in the allocated memory resources. The encoder combines the primary information for each code block with the parity information generated for the code block to generate a codeword. In a 1024-QAM example, the LDPC encoder may receive a 1620-bit code block and output a 1944-bit codeword that includes the original 1620 bits of primary information as well as 324 parity bits.

In block 904, the transmitting device generates a first wireless packet including the codewords generated in block 902. For example, the transmitting device may generate the first wireless packet in the form of a first PHY layer (or "level") PDU, and more specifically, a first PPDU including a PSDU payload that contains the codewords. The transmitting device may then transmit, or output for transmission (hereinafter used interchangeably with "transmit"), the first wireless packet to a receiving device via a first wireless channel of a first wireless link in block 906. The transmitting device may transmit the first wireless packet over the first wireless channel of the first wireless link via one or more coupled antennas and utilizing any suitable techniques including SU-MIMO, MU-MIMO and OFDMA techniques conforming to one or more of the IEEE 802.11 family of wireless communication protocol standards (such as that defined by the IEEE 802.11-2016 specification or amendments thereof including, but not limited to, 802.11ax and 802.11be). In some implementations, the first wireless channel can be a 20 MHz, 40 MHz, 80 MHz, 160 MHz or 320 MHz channel including one or more contiguous or non-contiguous portions.

In block 908, the transmitting device may receive a codeword acknowledgement from the receiving device via a second wireless channel of a second wireless link. By transmitting the codeword acknowledgement on a different wireless channel and wireless link than the first wireless channel, the receiving device may transmit, and the transmitting device may receive, the codeword acknowledgement within a duration of the first wireless packet. In this way, the transmitting device can continue its transmission of the first wireless packet while receiving the codeword acknowledgement for one or more first codewords or first groups of codewords of the multiple codewords to be transmitted in the first wireless packet. In some implementations, the second wireless channel can be a 20 MHz channel not within and not overlapping with the first wireless channel. In some other implementations, the first wireless channel may consist of a first set of tones of a 20 MHz, 40 MHz, 80 MHz, 160 MHz or 320 MHz wireless channel, and the second wireless channel may consist of a second set of different tones of the same 20 MHz, 40 MHz, 80 MHz, 160 MHz or 320 MHz wireless channel.

In some implementations, the codeword acknowledgement indicates, for each codeword of one or more received codewords in the first wireless packet, or for each of one or more received groups of codewords in the first wireless packet, whether the respective codeword or the respective group of codewords was successfully decoded or not successfully decoded by the receiving device. For example, the codeword acknowledgement may include a bitmap in which a binary value of each bit indicates whether a respective one of the codewords was successfully decoded (also referred to herein as an acknowledgement (ACK)) or not successfully decoded (also referred to herein as a negative acknowledgement (NACK)). Alternatively, as another example, the codeword acknowledgement may include a bitmap in which a binary value of each bit indicates whether a respective group of codewords was successfully decoded.

In some implementations, for each of the codewords that the codeword acknowledgement indicated as being successfully decoded, the transmitting device may deallocate the memory resources used to store the respective primary information and parity information, and as such, free up memory resources that may be allocated to new data. In some other implementations, the transmitting device may maintain storage of the primary information and the parity information until it receives indications that all of the codewords in the PSDU were successfully decoded.

For each of one or more of the codewords indicated (either individually or by group) by the codeword acknowledgement as not being successfully decoded, the transmitting device transmits in block 910, via the first wireless channel to the receiving device, a respective instance of parity information based on the respective primary information. In some implementations of block 910, to transmit the respective instances of parity information, the transmitting device may employ Chase combining techniques and, for example, retransmit the entireties of the unsuccessfully decoded codewords including both the primary information and the original parity information (such that the respective instance of parity information includes all of the parity information generated in block 902). For example, the transmitting device may retrieve the primary information and the parity information from memory resources allocated to the codeword and retransmit both the primary information and the original parity information. In some other implementations, the transmitting device may not retransmit the primary information associated with the unsuccessfully decoded codewords.

Additionally or alternatively, the respective instances of parity information transmitted for the unsuccessfully decoded codewords may include different parity information than that originally included with the codewords in the first wireless packet. In some such implementations, the transmitting device may employ incremental redundancy techniques. For example, in some implementations of block 902, the transmitting device generates, for each of the code blocks, multiple instances of parity information. The transmitting device may then allocate memory resources for the multiple instances of parity information and store the parity information using the allocated memory resources, for example, with the respective primary information. For example, the combination of the parity information with the primary information in each of the codewords in the first wireless packet may include only a first instance of parity information of the multiple instances of parity information associated with the respective code block. In such an example, the respective instance of parity information transmitted for each of the unsuccessfully decoded codewords may include only a second instance of parity information of the multiple instances of parity information associated with the code block. In some implementations, the second instance of parity information includes more parity bits than the first instance of parity information such that it may be more likely that the receiving device is able to successfully decode the primary information. In some implementations of block 902, to generate the multiple instances of parity information for each of the encoded code blocks, the transmitting device divides the respective parity information into a plurality of subsets of parity bits, each of the instances of parity information for the code block consisting of a corresponding one of the subsets of parity bits.

In some other implementations, the transmitting device may generate the respective instances of parity information for the unsuccessfully decoded codewords in response to the first codeword acknowledgement. In some such implementations, the transmitting device also may regenerate the respective primary information associated with the unsuccessfully decoded codewords before generating the respective instances of parity information. In this manner, the memory resources associated with the primary information and parity information may be deallocated after each transmission. However, there is also a tradeoff here because regenerating the primary information may necessitate more design complexity.

As similarly described above, after transmitting the parity information associated with the unsuccessfully decoded codewords, the transmitting device may then receive, via the second wireless channel from the receiving device, a second codeword acknowledgement. The second codeword acknowledgement may indicate, for at least one of the codewords indicated by the first codeword acknowledgement as not being successfully decoded, that the codeword was again not successfully decoded by the receiving device. This cycle may repeat for a given codeword as long as the receiving device continues to fail to successfully decode the codeword. In some implementations, after a last remaining instance of parity information associated with a codeword has been transmitted, and after the transmitting device receives a codeword acknowledgement indicating that the codeword was still not successfully decoded, the transmitting device may retransmit the entire PSDU included in the first PPDU. In some other implementations in which the instances of parity information are generated on demand after receiving a codeword acknowledgement, the transmitting device may retransmit the entire PSDU after a threshold number of attempted retransmissions.

In some implementations, the transmitting device may transmit the respective instances of parity information for the unsuccessfully decoded codewords in a second, subsequent wireless packet, which may be transmitted within the same TXOP as the first wireless packet. In some such implementations, the payload of the second wireless packet may contain only the retransmitted codewords or respective instances of parity information, and not any new data. In some other implementations, the transmitting device may combine the retransmitted codewords, or just the respective instances of parity information, with new codewords that have not been previously transmitted. In some other implementations, the transmitting device may transmit the respective instances of parity information in the same first wireless packet in which the unsuccessfully decoded codewords were originally transmitted.

As described above, by transmitting a codeword acknowledgement on a second, different wireless channel, the transmitting device may continue its transmission of the first wireless packet while receiving the codeword acknowledgement for one or more first codewords or first groups of codewords to be transmitted in the first wireless packet. This, in turn, enables the transmitting device to retransmit the unsuccessfully decoded codewords, or at least additional instances of parity information, in the same wireless packet in which the unsuccessfully decoded codewords were originally transmitted. For example, a receiving device may transmit codeword acknowledgements on a codeword basis or on a group-of-codewords basis. In such an example, the receiving device may transmit multiple codeword acknowledgements to acknowledge all of the codewords in a given wireless packet.

In some instances, the transmitting device may determine that the second wireless channel is not available and continue to buffer data for the receiving device. In some implementations, in response to determining that an amount of buffered data in its transmit buffer has exceeded a threshold, the transmitting device may transmit the buffered primary information and most or all of the parity information generated for the respective codewords. Transmitting more parity information increases the reliability associated with the transmissions of the codewords and, as a result, increases the likelihood that the receiving device will be able to successfully decode the primary information. Additionally or alternatively, the transmitting device may reduce an MCS value used in transmitting the codewords. For example, the modulation constellation size used in the modulation may be reduced to, for example, allow for lower SNR. Similarly, the transmitting device may receive a report or other indication of a state of the receiving device's receive buffer and, in response to determining that an amount of buffered data in the receiving device's receive buffer has exceeded a threshold, reduce the MCS value. In this way, the MCS may be reduced when the buffers are at or near capacity because the penalty associated with retransmission is large. In contrast, a higher MCS may otherwise be selected because the penalty associated with retransmission is reduced when there are more memory resources available.

In some implementations, to further reduce latency in the wireless network, the second wireless channel also can be used for data communications. For example, the receiving device for the first wireless packet may transmit, on the second wireless channel, a second wireless packet to the transmitting device of the first wireless packet. In some such implementations, the receiving device of the first wireless packet may combine the codeword acknowledgement for the first wireless packet with additional codewords in the second wireless packet. In some implementations in which either of the transmitting device or the receiving device is an AP, the AP can control and coordinate the transmission and acknowledgement sequences on both the first and the second wireless channels. For example, the AP may coordinate the transmissions such that when the transmitting device is transmitting to the receiving device on the first wireless channel, the receiving device is transmitting to the transmitting device on the second wireless channel. In other words, when one of the wireless channels is used for DL transmissions, the other of the wireless channels is used for UL transmissions.

Figure 10:
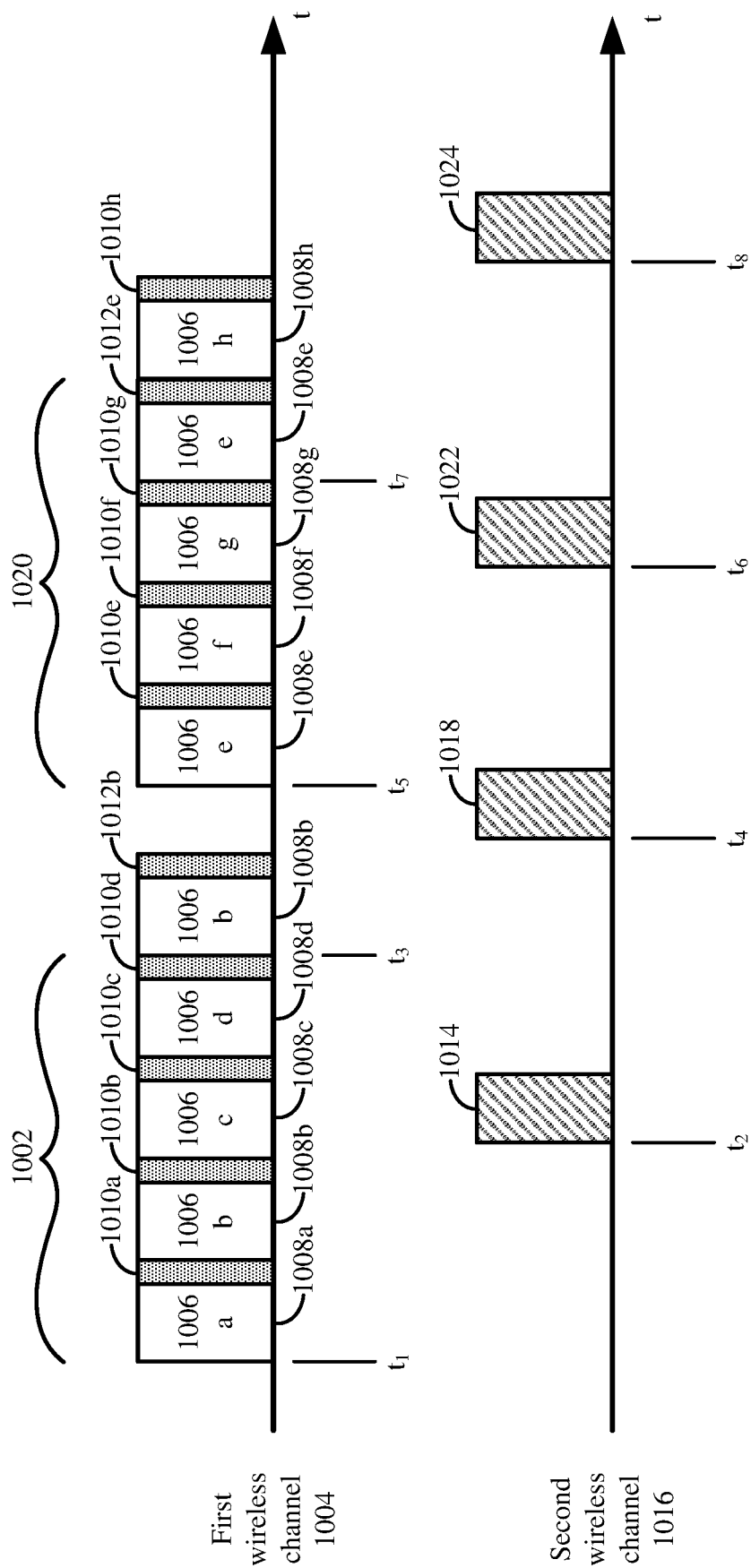
FIG. 10 shows a timing diagram illustrating the transmissions of communications in some implementations of the example process of FIG. 9.

FIG. 10 shows a timing diagram illustrating the transmissions of communications in some implementations of the example process 900 of FIG. 9. As shown, the transmitting device begins transmitting the first wireless packet 1002 at time $t_1$ to the receiving device via the first wireless channel 1004. For didactic purposes, FIG. 10 illustrates an example in which the first wireless packet 1002 includes a PSDU comprising four codewords 1006a, 1006b, 1006c and 1006d; however, the PSDU may include any number of codewords, for example, within the limit imposed by the associated TXOP. Each codeword includes respective primary information and respective parity information based on the primary information. For example, the codewords 1006a, 1006b, 1006c and 1006d may include systematic portions 1008a, 1008b, 1008c and 1008d, respectively, that include the primary information, and parity portions 1010a, 1010b, 1010c and 1010d, respectively, that include the parity information.

The receiving device may then begin receiving the first wireless packet 1002 and attempt to decode the codewords within it based on the primary information and the parity information. After an initial duration of time or number of codewords, the receiving device may then transmit, for each of the codewords (for example, codewords 1006a and 1006b), an acknowledgement if the codeword was decoded successfully, or a negative acknowledgement if the codeword was not decoded successfully. For example, after the reception of the codewords 1006a and 1006b, the receiving device may transmit a first codeword acknowledgement 1014 to the transmitting device via the second wireless channel 1016 at time $t_2$ during the transmission of the first wireless packet 1002. The first codeword acknowledgement 1014 may include a bitmap in which a binary value of each bit indicates whether a respective one of the codewords, or a respective group of codewords, was successfully decoded. For didactic purposes, FIG. 10 illustrates an example in which the first codeword acknowledgement 1014 indicates that codeword 1006b was not successfully decoded.

As shown in FIG. 10, the transmitting device retransmits the codeword 1006b including the systematic portion 1008b at time $t_3$ within the transmission of the first wireless packet 1002 after the codewords 1006c and 1006d. The retransmission of the codeword 1006b includes parity portion 1012b, which may include the same or different parity information as the parity portion 1010b previously transmitted earlier in the first wireless packet 1002. As described above, the receiving device may receive the codewords 1006c and 1006d and the retransmitted codeword 1006b and attempt to decode these codewords based on the respective primary information and the respective parity information. The receiving device may then transmit, for each of the codewords, an acknowledgement if the codeword was decoded successfully, or a negative acknowledgement if the codeword was not decoded successfully. For example, after the reception of the codewords 1006c and 1006d and the retransmitted codeword 1006b, the receiving device may transmit a second codeword acknowledgement 1018 to the transmitting device via the second wireless channel 1016 at time $t_4$. FIG. 10 illustrates an example in which the second codeword acknowledgement 1018 indicates that all of the codewords 1006b, 1006c and 1006d were successfully decoded.

As shown, in the same or a different TXOP, the transmitting device may then begin transmitting a second wireless packet 1020 at time $t_5$ to the receiving device via the first wireless channel 1004. For didactic purposes, FIG. 10 illustrates an example in which the second wireless packet 1020 also includes a PSDU comprising four codewords 1006e, 1006f, 1006g and 1006h. The codewords 1006e, 1006f, 1006g and 1006h may include systematic portions 1008e, 1008f, 1008g and 1008h, respectively, and parity portions 1010e, 1010f, 1010g and 1010h, respectively. As similarly described with reference to the first wireless packet 1002, after receiving the codewords 1006e and 1006f, the receiving device may then transmit, at time $t_6$, a first codeword acknowledgement 1022 via the second wireless channel 1016 during the duration of the second wireless packet 1020. In the illustrated example, the first codeword acknowledgement 1022 indicates that one of the codewords (codeword 1006e) was not successfully decoded. The receiving device may then retransmit the codeword 1006e including parity portion 1012e at time $t_7$ within the second wireless packet 1020 after an additional codeword 1006g and, in the example shown, before a last codeword 1006h. As described above, the parity portion 1012e may include the same or different parity information as the parity portion 10104 previously transmitted earlier in the second wireless packet 1020. In the illustrated example, the receiving device then transmits a second codework acknowledgement 1024 at time t₈ indicating that all of the codewords were successfully decoded.

Figure 11:
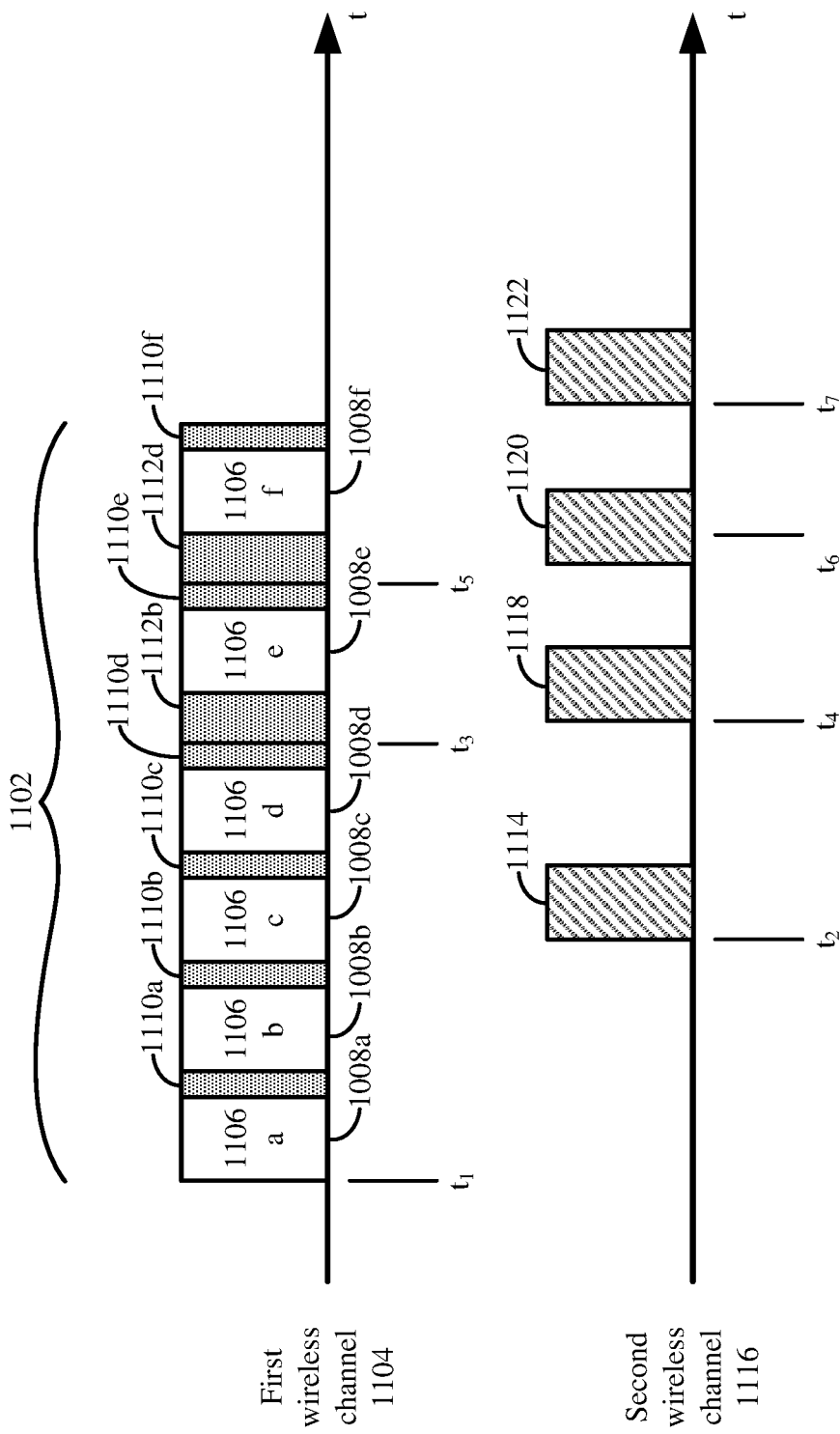
FIG. 11 shows another timing diagram illustrating the transmissions of communications in some implementations of the example process of FIG. 9.

FIG. 11 shows another timing diagram illustrating the transmissions of communications in some implementations of the example process 900 of FIG. 9. As shown, the transmitting device begins transmitting the first wireless packet 1102 at time t₁ to the receiving device via the first wireless channel 1104. For didactic purposes, FIG. 11 illustrates an example in which the first wireless packet 1102 includes a PSDU comprising six codewords 1106a, 1106b, 1106c, 1106d, 1106e and 1106f; however, the PSDU may include any number of codewords, for example, within the limit imposed by the associated TXOP. Each codeword includes respective primary information and respective parity information based on the primary information. For example, the codewords 1106a, 1106b, 1106c, 1106d, 1106e and 1106f may include systematic portions 1108a, 1108b, 1108c, 1108d, 1108e and 1108f, respectively, and parity portions 1110a, 1110b, 1110c, 1110d, 1110e and 1110f, respectively.

The receiving device may then begin receiving the first wireless packet 1102 and attempt to decode the codewords within it based on the primary information and the parity information. After an initial duration of time or number of codewords, the receiving device may then transmit, for each of the codewords (for example, codewords 1106a and 1106b), an acknowledgement if the codeword was decoded successfully, or a negative acknowledgement if the codeword was not decoded successfully. For example, after the reception of the codewords 1106a and 1106b, the receiving device may transmit a first codeword acknowledgement 1114 to the transmitting device via the second wireless channel 1116 at time t₂ during the transmission of the first wireless packet 1102. The first codeword acknowledgement 1114 may include a bitmap in which a binary value of each bit indicates whether a respective one of the codewords, or a respective group of codewords, was successfully decoded. For didactic purposes, FIG. 11 illustrates an example in which the first codeword acknowledgement 1114 indicates that codeword 1106b was not successfully decoded.

The transmitting device may then transmit the codewords 1106c and 1106d before transmitting parity information 1112b for the codeword 1106b at time t₃ within the transmission of the first wireless packet 1102. As described above, the receiving device may receive the codewords 1106c and 1106d and attempt to decode the respective codewords based on the respective primary information and the respective parity information. The receiving device may then transmit, for each of the codewords 1106c and 1106d, an acknowledgement if the codeword was decoded successfully, or a negative acknowledgement if the codeword was not decoded successfully. For example, the receiving device may transmit a second codeword acknowledgement 1118 at time t₄. FIG. 11 illustrates an example in which the second codeword acknowledgement 1118 indicates that the codeword 1106d was not successfully decoded.

As described above, after transmitting the codewords 1206c and 1206d, the transmitting device may transmit parity information 1212b for the codeword 1206b at time t₃. In contrast to the example shown and described with reference to FIG. 10, in the example of FIG. 11, the transmitting device transmits only additional parity information 1112b for the codeword 1106b at time t₃. That is, the transmitting device does not retransmit the entire codeword or original primary information. As described above with reference to the process 900 of FIG. 9, the parity portion 1110b may be a first instance of parity information and the parity information 1112b may be a second instance of parity information that may be different than the first instance of parity information. For example, the parity portion 1112b may include more parity information than the parity portion 1110b.

In the illustrated example, the transmitting device may then transmit the codeword 1106e after the parity information 1112b for the codeword 1106b within the transmission of the first wireless packet 1102. The transmitting device may then transmit parity information 1112d for the codeword 1106d at time t₅ within the transmission of the first wireless packet 1102. As described above, the transmitting device transmits only additional parity information 1112d for the codeword 1106d at time t₅. As also described above, the parity portion 1112d may be different than the parity portion 1110d, for example, the parity portion 1112d may include more parity information than the parity portion 1110d.

After receiving the parity information 1112b and the codeword 1106e, the receiving device may transmit, for each of the codewords 1106b and 1106e, an acknowledgement if the codeword was decoded successfully, or a negative acknowledgement if the codeword was not decoded successfully. For example, the receiving device may transmit a third codeword acknowledgement 1120 at time t₆. FIG. 11 illustrates an example in which the third codeword acknowledgement 1118 indicates that the codewords 1106b and 1106e were successfully decoded.

In the example shown, the transmitting device may then transmit the codeword 1106f after the parity information 1112d for the codeword 1106d within the transmission of the first wireless packet 1102. After receiving the parity information 1112d and the codeword 1106f, the receiving device may transmit, for each of the codewords 1106d and 1106f, an acknowledgement if the codeword was decoded successfully, or a negative acknowledgement if the codeword was not decoded successfully. For example, the receiving device may transmit a fourth codeword acknowledgement 1122 at time t₇. FIG. 11 illustrates an example in which the fourth codeword acknowledgement 1122 indicates that the codewords 1106d and 1106f were successfully decoded.

Figure 12:
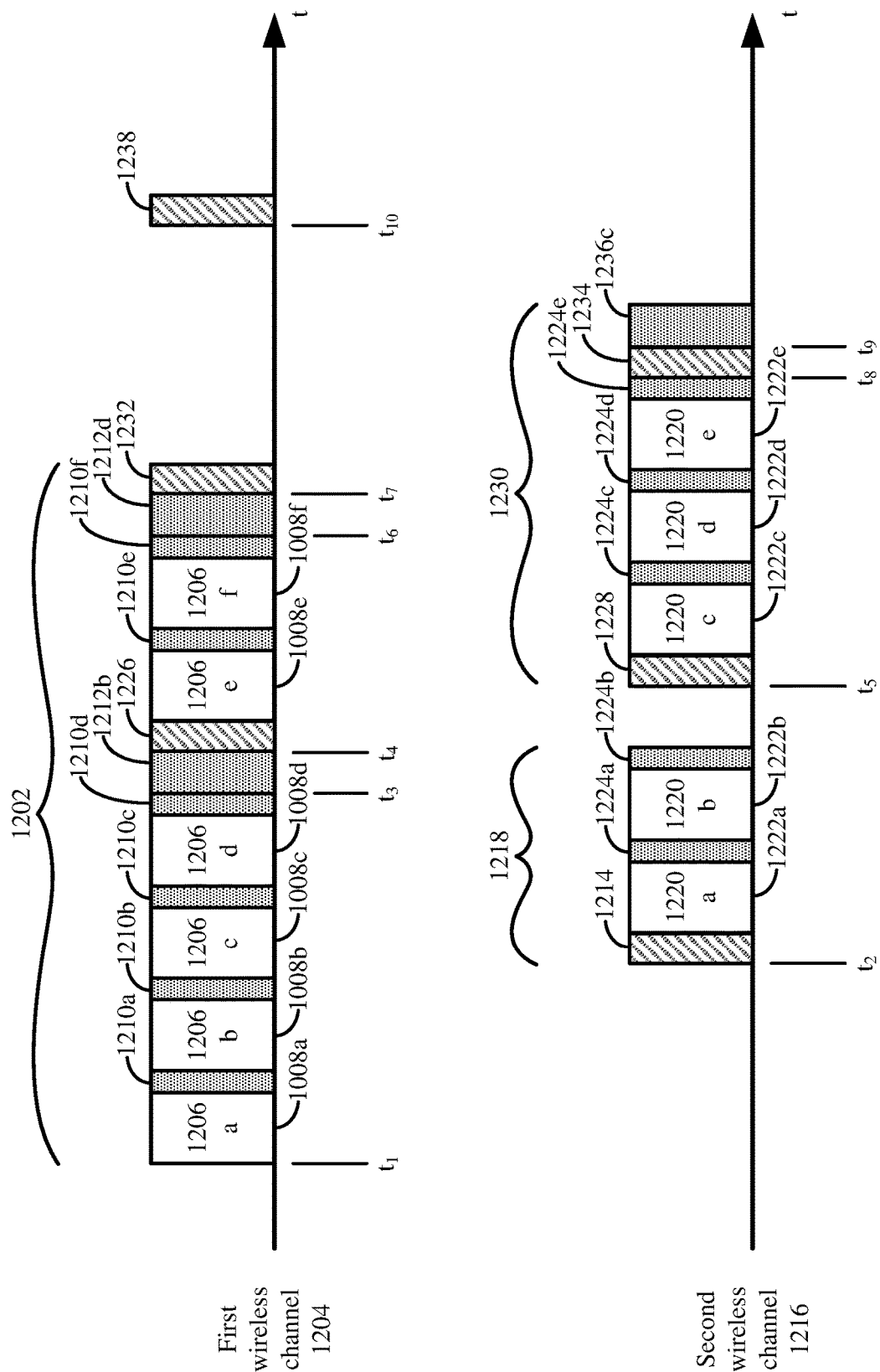
FIG. 12 shows another timing diagram illustrating the transmissions of communications in some implementations of the example process of FIG. 9.

FIG. 12 shows another timing diagram illustrating the transmissions of communications in some implementations of the example process 900 of FIG. 9. In contrast to the example shown and described with reference to FIG. 11, data communications are also transmitted on the second wireless channel. As shown, the transmitting device begins transmitting the first wireless packet 1202 at time t₁ to the receiving device via the first wireless channel 1204. For didactic purposes, FIG. 12 illustrates an example in which the first wireless packet 1202 includes a PSDU comprising six codewords 1206a, 1206b, 1206c, 1206d, 1206e and 1206f; however, the PSDU may include any number of codewords, for example, within the limit imposed by the associated TXOP. Each codeword includes respective primary information and respective parity information based on the primary information. For example, the codewords 1206a, 1206b, 1206c, 1206d, 1206e and 1206f may include systematic portions 1208a, 1208b, 1208c, 1208d, 1208e and 1208f, respectively, and parity portions 1210, 1210b, 1210c, 1210d, 1210e and 1210f, respectively.

The receiving device may then begin receiving the first wireless packet 1202 and attempt to decode the codewords within it based on the primary information and the parity information. After an initial duration of time or number of codewords, the receiving device may then transmit, for each of the codewords (for example, codewords 1206a and 1206b), an acknowledgement if the codeword was decoded successfully, or a negative acknowledgement if the codeword was not decoded successfully. For example, after the reception of the codewords 1206a and 1206b, the receiving device may transmit a first codeword acknowledgement 1214 to the transmitting device via the second wireless channel 1216 at time $t_2$ during the transmission of the first wireless packet 1202. The first codeword acknowledgement 1214 may include a bitmap in which a binary value of each bit indicates whether a respective one of the codewords, or a respective group of codewords, was successfully decoded. For didactic purposes, FIG. 12 illustrates an example in which the first codeword acknowledgement 1214 indicates that codeword 1206b was not successfully decoded.

As described above, the second wireless channel 1216 also can be used for data communications. For example, the receiving device for the first wireless packet 1202 may transmit, on the second wireless channel 1216, a second wireless packet 1218 to the transmitting device of the first wireless packet 1202. In some such implementations, the receiving device of the first wireless packet 1202 may combine the first codeword acknowledgement 1214 for the first wireless packet 1202 with additional codewords 1220a and 1220b, including respective systematic portions 1222a and 1222b and parity portions 1224a and 1224b, in the second wireless packet 1218.

In some implementations in which either of the transmitting device or the receiving device is an AP, the AP can control and coordinate the transmission and acknowledgement sequences on both the first wireless channel 1204 and the second wireless channel 1216. For example, the AP may coordinate the transmissions such that when the transmitting device is transmitting the first wireless packet 1202 to the receiving device on the first wireless channel 1204, the receiving device is transmitting the second wireless packet 1218 to the transmitting device on the second wireless channel 1216. In other words, when one of the wireless channels is used for DL transmissions, the other of the wireless channels is used for UL transmissions, and vice versa. For example, the transmitting device may transmit a trigger frame on the second wireless channel 1216 that triggers the receiving device to transmit the second wireless packet 1218.

While receiving the second wireless packet 1218 via the second wireless channel 1216, the transmitting device may transmit the codewords 1206c and 1206d within the transmission of the first wireless packet 1202. After transmitting the codewords 1206c and 1206d, the transmitting device may then transmit parity information 1212b for the codeword 1206b at time $t_3$. In contrast to the example shown and described with reference to FIG. 10, in the example of FIG. 12, the transmitting device transmits only additional parity information 1212b for the codeword 1206b at time $t_3$. That is, the transmitting device does not retransmit the entire codeword or original primary information. As described above with reference to the process 900 of FIG. 9, the parity portion 1210b may be a first instance of parity information and the parity information 1212b may be a second instance of parity information that may be different than the first instance of parity information.

In some implementations, after receiving and attempting to decode the codewords 1220a and 1220b in the second wireless packet 1218, the transmitting device transmits a second codeword acknowledgement 1226 to the receiving device at time $t_4$ within the first wireless packet 1202. For didactic purposes, FIG. 12 illustrates an example in which the second codeword acknowledgement 1226 indicates that the codewords 1220a and 1220b were successfully decoded.

In some implementations, after receiving and attempting to decode the codewords 1206c and 1206d in the first wireless packet 1202, the receiving device transmits a third codeword acknowledgement 1228 to the transmitting device at time $t_5$ within the first wireless packet 1202. For didactic purposes, FIG. 12 illustrates an example in which the third codeword acknowledgement 1228 indicates that the codeword 1206d was not successfully decoded. The receiving device for the first wireless packet 1202 may transmit, on the second wireless channel 1216, a third wireless packet 1230 to the transmitting device of the first wireless packet 1202. In some such implementations, the receiving device of the first wireless packet 1202 may combine the third codeword acknowledgement 1228 for the codewords 1206b, 1206c and 1206d with additional codewords 1220c, 1220d and 1220e, including respective systematic portions 1222c, 1222d and 1222e and parity portions 1224c, 1224d and 1224e, in the third wireless packet 1230.

After transmitting the parity information 1212b and the second codeword acknowledgement 1226, the transmitting device may transmit the codewords 1206e and 1206f. In the illustrated example, the transmitting device may then transmit parity information 1212d for the codeword 1206d at time $t_6$ within the transmission of the first wireless packet 1202. In some implementations, after receiving and attempting to decode the codeword 1220c in the third wireless packet 1230, the transmitting device transmits a fourth codeword acknowledgement 1232 to the receiving device at time $t_7$ within the first wireless packet 1202. For didactic purposes, FIG. 12 illustrates an example in which the fourth codeword acknowledgement 1232 indicates that the codeword 1216c was not successfully decoded.

After receiving the parity information 1212d and the codewords 1206e and 1206f, the receiving device may transmit, for each of the codewords 1206d, 1206e and 1206f, an acknowledgement if the codeword was decoded successfully, or a negative acknowledgement if the codeword was not decoded successfully. For example, the receiving device may transmit a fifth codeword acknowledgement 1234 at time $t_8$. FIG. 12 illustrates an example in which the fifth codeword acknowledgement 1234 indicates that the codewords 1206d, 1206e and 1206f were successfully decoded.

The receiving device of the first wireless packet 1202 may transmit parity information 1236c for the codeword 1220c at time $t_9$. After receiving the parity information 1236c and the codewords 1220d and 1220e, the transmitting device may transmit, for each of the codewords 1220c, 1220d and 1220e, an acknowledgement if the codeword was decoded successfully, or a negative acknowledgement if the codeword was not decoded successfully. For example, the transmitting device may transmit a sixth codeword acknowledgement 1238 at time $t_{10}$, which, in this example, indicates that the codewords 1220c, 1220d and 1220e were successfully decoded.

Figure 13:
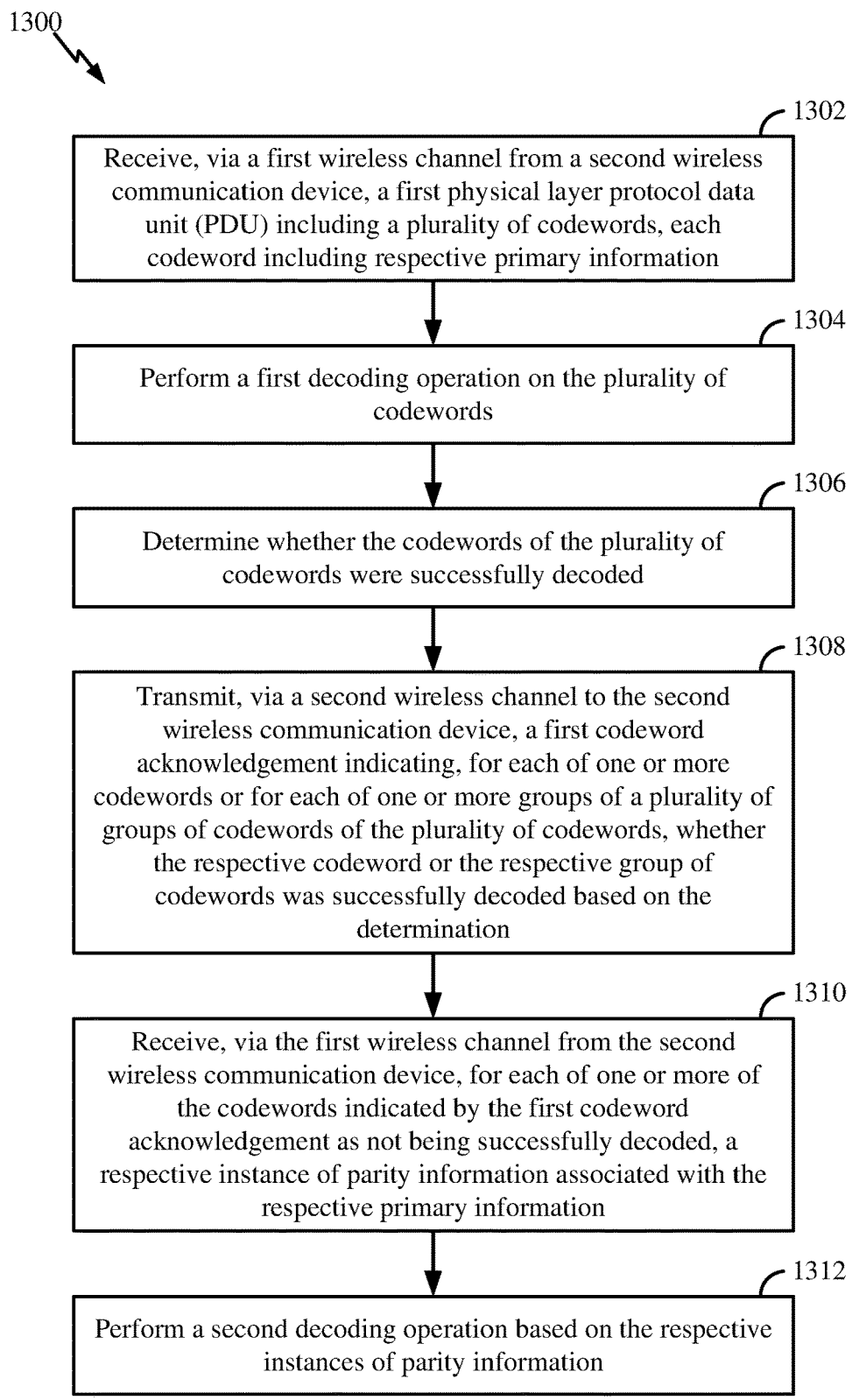
FIG. 13 shows a flowchart illustrating an example process for wireless communication that supports acknowledgement and retransmission techniques according to some implementations.

FIG. 13 shows a flowchart illustrating an example process 1300 for wireless communication that supports acknowledgement and retransmission techniques according to some implementations. The operations of the process 1300 may be implemented by a receiving device, such as an AP or a STA, or components thereof, as described herein. For example, the process 1300 may be performed by a wireless communication device such as the wireless communication device 500 described above with reference to FIG. 5. In some implementations, the process 1300 may be performed by an AP, such as one of the APs 102 and 602 described above with reference to FIGS. 1 and 6A, respectively. In some implementations, the process 1300 may be performed by a STA, such as one of the STAs 104 and 604 described above with reference to FIGS. 1 and 6B, respectively.

In some implementations, the receiving device is configured for dual band simultaneous communication. For example, the receiving device may include a first radio for communicating with a transmitting device via a first wireless link in a first band, and may include a second radio for communicating with the transmitting device via a second wireless link in a different subband of the first band or in a second band. In some implementations, the receiving device is further configured for multilink aggregation. For example, the receiving device may be configured to aggregate the first and the second wireless links to enable simultaneous reception from the transmitting device and transmission to the transmitting device.

In block 1302, the receiving device receives, via a first wireless channel of a first wireless link from a transmitting device, a first wireless packet including multiple codewords. Each codeword includes a systematic portion that contains primary information representative of some or all of one or more MPDUs in the form of bits. The receiving device may receive the first wireless packet in the form of a first PHY level PDU, and more specifically, a first PPDU including a PSDU payload that contains the codewords. The receiving device may receive the first wireless packet over the first wireless channel via one or more coupled antennas and utilizing any suitable techniques including SU-MIMO, MU-MIMO and OFDMA techniques conforming to one or more of the IEEE 802.11 family of wireless communication protocol standards (such as that defined by the IEEE 802.11-2016 specification or amendments thereof including, but not limited to, 802.11ax and 802.11be). In some implementations, the first wireless channel can be a 20 MHz, 40 MHz, 80 MHz, 160 MHz or 320 MHz channel including one or more contiguous or non-contiguous portions.

In block 1304, the receiving device may perform a first decoding operation on the multiple codewords in an attempt to decode the codewords. In some implementations, to perform the first decoding operation, the codewords received in block 1302 are provided to an LDPC decoder that decodes the codewords to generate multiple respective code blocks. In some implementations, on a per-codeword basis, the LDPC decoder receives a codeword including primary information and parity information, and combines the primary information with the parity information to decode the codeword and generate a respective code block. In general, the parity information is used for error correction of the primary information to increase the integrity of the decoded primary information. In some implementations, the performance of the first decoding operation in block 1304 produces a log-likelihood ratio (LLR) representation of the primary information that is also stored in the memory resources. In some implementations, combining the primary information with the parity information includes inputting the LLR representation into an iterative decoding operation for implementing forward error correction using the parity information. Each additional instance of parity information associated with a codeword may improve the probability of accurately decoding the respective primary information.

In block 1306, the receiving device determines whether codewords of the multiple codewords were successfully decoded in block 1304. In some implementations, for each of the codewords that was successfully decoded, the receiving device may deallocate the memory resources used to store the respective primary information and parity information, and as such, free up memory resources that may be allocated to new data. In some other implementations, the receiving device may maintain storage of the primary information and the parity information until it successfully decodes all of the codewords in the PSDU.

In some implementations, in block 1308, the receiving device transmits, via a second wireless channel of a second wireless link to the transmitting device, a codeword acknowledgement (such as a codeword block acknowledgement) based on the determinations made in block 1306. By transmitting the codeword acknowledgement on a different wireless channel than the first wireless channel, the receiving device may transmit, and the transmitting device may receive, the codeword acknowledgement within a duration of the first wireless packet. In this way, the receiving device can continue its reception of the first wireless packet while transmitting the codeword acknowledgement for one or more first codewords or first groups of codewords of the multiple codewords to be transmitted in the first wireless packet. In some implementations, the second wireless channel can be a 20 MHz channel not within and not overlapping with the first wireless channel. In some other implementations, the first wireless channel may consist of a first set of tones of a 20 MHz, 40 MHz, 80 MHz, 160 MHz or 320 MHz wireless channel, and the second wireless channel may consist of a second set of different tones of the same 20 MHz, 40 MHz, 80 MHz, 160 MHz or 320 MHz wireless channel.

In some implementations, the codeword acknowledgement indicates, for each codeword of one or more received codewords in the first wireless packet, or for each of one or more received groups of codewords in the first wireless packet, whether the respective codeword or the respective group of codewords was successfully decoded or not successfully decoded by the receiving device. For example, the codeword acknowledgement may include a bitmap in which a binary value of each bit indicates whether a respective one of the codewords was successfully decoded (an example of an ACK) or not successfully decoded (an example of a NACK). Alternatively, as another example, the codeword acknowledgement may include a bitmap in which a value of each bit indicates whether a respective group of codewords was successfully decoded or not successfully decoded.

Subsequently, in block 1310, the receiving device may receive, via the first wireless channel from the transmitting device, an instance of parity information associated with the respective primary information corresponding to each of one or more of the codewords indicated by the codeword acknowledgement as not being successfully decoded. In some implementations, the transmitting device may retransmit, and the receiving device may receive in block 1310, the entireties of the unsuccessfully decoded codewords including the previously transmitted primary information. In some other implementations, the transmitting device may not retransmit the primary information associated with the unsuccessfully decoded codewords.

In some implementations, each of the codewords received in block 1302 further includes parity information. In some implementations, the instances of parity information received in block 1310 for the unsuccessfully decoded codewords include the original parity information received with the codewords in block 1302. In some other implementations, the respective instances of parity information received for each of the unsuccessfully decoded codewords in block 1310 may include different parity information than that originally included with the codewords in the first wireless packet. For example, in some implementations, the transmitting device generates, for each of the code blocks, multiple instances of parity information. For example, the parity information transmitted with the primary information for each codeword in the first wireless packet may include a first instance of parity information and each instance of parity information received in block 1310 may be a second or subsequent instance of parity information associated with the primary information. In some implementations, each second (or subsequent) instance of parity information includes more parity bits than the first (or previous) instance of parity information such that it may be more likely that the receiving device is able to successfully decode the primary information.

In block 1312, the receiving device may then perform a second decoding operation based on the respective instances of parity information as similarly described for block 1304. For example, in some implementations the performance of the second decoding operation in block 1312 combines the primary information and first instance of parity information associated with each of the codewords with the second instance of parity information for the codeword. This process may repeat until each codeword is successfully decoded and, as described above, each additional instance of parity information associated with a codeword may improve the probability of accurately decoding the respective primary information.

In some implementations, the receiving device may receive the respective instances of parity information for the unsuccessfully decoded codewords in a second, subsequent wireless packet, which may be transmitted within the same TXOP as the first wireless packet. In some such implementations, the payload of the second wireless packet may contain only the retransmitted codewords or respective instances of parity information, and not any new data. In some other implementations, the receiving device may receive a second wireless packet that includes the retransmitted codewords, or just the respective instances of parity information, as well as new codewords that have not been previously transmitted. In some other implementations, the receiving device may receive the respective instances of parity information in the same first wireless packet in which the unsuccessfully decoded codewords were originally received. As described above, by transmitting a codeword acknowledgement on a second, different wireless channel, the receiving device may continue its reception of the first wireless packet while transmitting the codeword acknowledgement for one or more first codewords or first groups of codewords in the first wireless packet. This, in turn, enables the receiving device to receive retransmitted codewords, or at least respective instances of parity information, in the same wireless packet in which the unsuccessfully decoded codewords were originally transmitted. For example, the receiving device may transmit codeword acknowledgements on a codeword basis or on a group-of-codewords basis. In such an example, the receiving device may transmit multiple codeword acknowledgements to acknowledge all of the codewords in a given wireless packet.

As described above, in some implementations, to further reduce latency in the wireless network, the second wireless channel also can be used for data communications. For example, the receiving device for the first wireless packet may transmit, on the second wireless channel, a second wireless packet to the transmitting device of the first wireless packet. In some such implementations, the receiving device of the first wireless packet may combine the codeword acknowledgement for the first wireless packet with additional codewords in the second wireless packet. As described above, in some implementations in which either of the transmitting device or the receiving device is an AP, the AP can control the transmission and acknowledgement sequences on both the first and the second wireless channels and otherwise coordinate the transmissions. For example, the AP may coordinate the transmissions such that when the transmitting device is transmitting data to the receiving device on the first wireless channel, the receiving device is transmitting data to the transmitting device on the second wireless channel. In other words, when one of the wireless channels is used for DL transmissions, the other of the wireless channels is used for UL transmissions.

Figure 14:
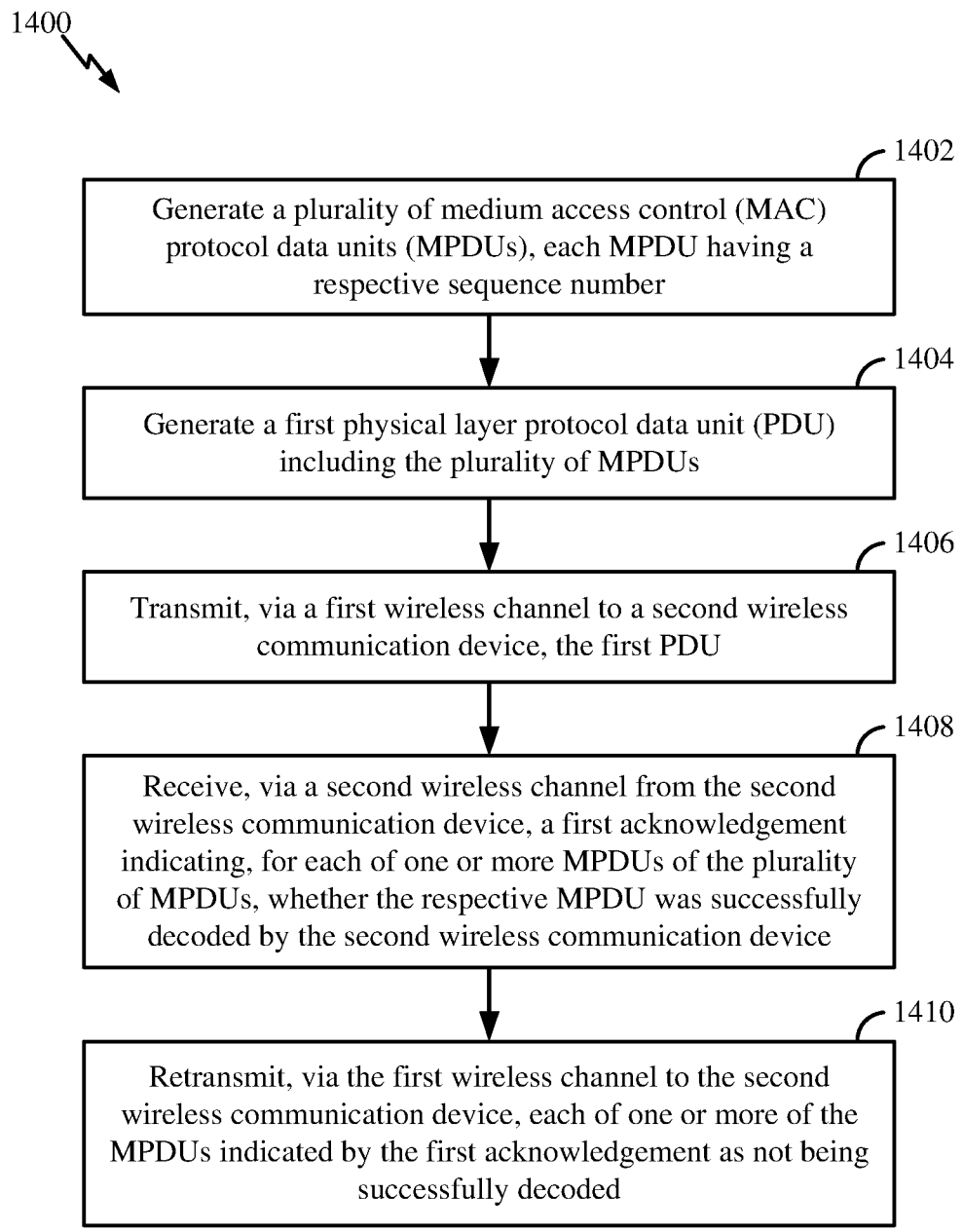
FIG. 14 shows a flowchart illustrating an example process for wireless communication that supports acknowledgement and retransmission techniques according to some implementations.

While aspects of the disclosure shown and described with reference to FIGS. 9-13 relate particularly to PHY level techniques, similar aspects may be relevant to MAC level techniques. FIG. 14 shows a flowchart illustrating an example process 1400 for wireless communication that supports acknowledgement and retransmission techniques according to some implementations. The operations of the process 1400 may be implemented by a transmitting device, such as an AP or a STA, or components thereof, as described herein. For example, the process 1400 may be performed by a wireless communication device such as the wireless communication device 500 described above with reference to FIG. 5. In some implementations, the process 1400 may be performed by an AP, such as one of the APs 102 and 602 described above with reference to FIGS. 1 and 6A, respectively. In some implementations, the process 1400 may be performed by a STA, such as one of the STAs 104 and 604 described above with reference to FIGS. 1 and 6B, respectively.

In some implementations, the transmitting device is configured for dual band simultaneous communication. For example, the transmitting device may include a first radio for communicating with a receiving device via a first wireless link in a first band, and may include a second radio for communicating with the receiving device via a second wireless link in a different subband of the first band or in a second band. In some implementations, the transmitting device is further configured for multilink aggregation. For example, the transmitting device may be configured to aggregate the first and the second wireless links to enable simultaneous transmission to the receiving device and reception from the receiving device.

In block 1402, the transmitting device generates multiple MPDUs, each MPDU having a respective sequence number. For example, a MAC layer of the transmitting device may receive one or more higher layer data units from an upper layer of the transmitting device, allocate memory resources for processing the data units, and encode the data units to generate the multiple MPDUs. Each MPDU is stored in the allocated memory resources and includes a systematic portion that contains primary information (or "systematic information") representative of some or all of one or more of the upper layer data units. The MPDUs may then be provided to a PHY layer of the transmitting device to generate multiple respective codewords as described above.

In block 1404, the transmitting device generates a first wireless packet including the MPDUs generated in block 1402. For example, the transmitting device may generate the first wireless packet in the form of a first PHY level PDU, and more specifically, a first PPDU including a PSDU payload that includes encoded bits representing the MPDUs generated in block 1402. The transmitting device may then transmit the first wireless packet to a receiving device via a first wireless channel of a first wireless link in block 1406. The transmitting device may transmit the first wireless packet over the first wireless channel via one or more coupled antennas and utilizing any suitable techniques including SU-MIMO, MU-MIMO and OFDMA techniques conforming to one or more of the IEEE 802.11 family of wireless communication protocol standards (such as that defined by the IEEE 802.11-2016 specification or amendments thereof including, but not limited to, 802.11ax and 802.11be). In some implementations, the first wireless channel can be a 20 MHz, 40 MHz, 80 MHz, 160 MHz or 320 MHz channel including one or more contiguous or non-contiguous portions.

In block 1408, the transmitting device may receive an acknowledgement (such as a block acknowledgement) from the receiving device via a second wireless channel of a second wireless link. By transmitting the acknowledgement on a different wireless channel than the first wireless channel, the receiving device may transmit, and the transmitting device may receive, the acknowledgement within a duration of the first wireless packet. In this way, the transmitting device can continue its transmission of the first wireless packet while receiving the acknowledgement for one or more first MPDUs of the multiple MPDUs to be transmitted in the first wireless packet. In some implementations, the second wireless channel can be a 20 MHz channel not within and not overlapping with the first wireless channel. In some other implementations, the first wireless channel may consist of a first set of tones of a 20 MHz, 40 MHz, 80 MHz, 160 MHz or 320 MHz wireless channel, and the second wireless channel may consist of a second set of different tones of the same 20 MHz, 40 MHz, 80 MHz, 160 MHz or 320 MHz wireless channel.

In some implementations, the acknowledgement indicates, for each MPDU of one or more received MPDUs in the first wireless packet, whether the respective MPDU was successfully decoded by the receiving device. For example, the acknowledgement may be a block acknowledgement that includes a bitmap in which a binary value of each bit indicates whether a respective one of the MPDUs was successfully decoded (also referred to herein as an ACK). In some implementations, for each of the MPDUs that the acknowledgement indicated as being successfully decoded, the transmitting device may deallocate the memory resources used to store the respective MPDU, and as such, free up memory resources that may be allocated to new data. For each of one or more of the MPDUs indicated by the acknowledgement as not being successfully decoded, the transmitting device retransmits, in block 1410, the respective MPDU via the first wireless channel to the receiving device.

As similarly described above, after retransmitting the previously unsuccessfully decoded MPDUs, the transmitting device may then receive, via the second wireless channel from the receiving device, a second acknowledgement (such as a block acknowledgement). The second acknowledgement may indicate, for at least one of the MPDUs indicated by the first acknowledgement as not being successfully decoded, that the MPDU was again not successfully decoded by the receiving device. This cycle may repeat for a given MPDU as long as the receiving device continues to fail to successfully decode the MPDU.

In some implementations, the transmitting device may retransmit the previously unsuccessfully decoded MPDUs in a second, subsequent wireless packet, which may be transmitted within the same TXOP as the first wireless packet. In some such implementations, the payload of the second wireless packet may contain only the retransmitted MPDUs, and not any new data. In some other implementations, the transmitting device may combine the retransmitted MPDUs with new MPDUs that have not been previously transmitted. In some other implementations, the transmitting device may retransmit the previously unsuccessfully decoded MPDUs in the same first wireless packet in which they were originally transmitted. As described above, by transmitting an acknowledgement on a second, different wireless channel, the transmitting device may continue its transmission of the first wireless packet while receiving the acknowledgement for one or more first MPDUs to be transmitted in the first wireless packet. This, in turn, enables the transmitting device to retransmit the unsuccessfully decoded MPDUs in the same wireless packet in which they were originally transmitted. For example, a receiving device may transmit acknowledgements on a per-MPDU or per-group-of-MPDUs (such as using a block acknowledgement) basis. In such an example, the receiving device may transmit multiple acknowledgements to acknowledge all of the MPDUs in a given wireless packet.

As described above, in some implementations, to further reduce latency in the wireless network, the second wireless channel also can be used for data communications. For example, the receiving device for the first wireless packet may transmit, on the second wireless channel, a second wireless packet to the transmitting device of the first wireless packet. In some such implementations, the receiving device of the first wireless packet may combine the acknowledgement for the first wireless packet with additional MPDUs in the second wireless packet. In some implementations in which either of the transmitting device or the receiving device is an AP, the AP can control and coordinate the transmission and acknowledgement sequences on both the first and the second wireless channels. For example, the AP may coordinate the transmissions such that when the transmitting device is transmitting data to the receiving device on the first wireless channel, the receiving device is transmitting data to the transmitting device on the second wireless channel. In other words, when one of the wireless channels is used for DL transmissions, the other of the wireless channels is used for UL transmissions.

Figure 15:
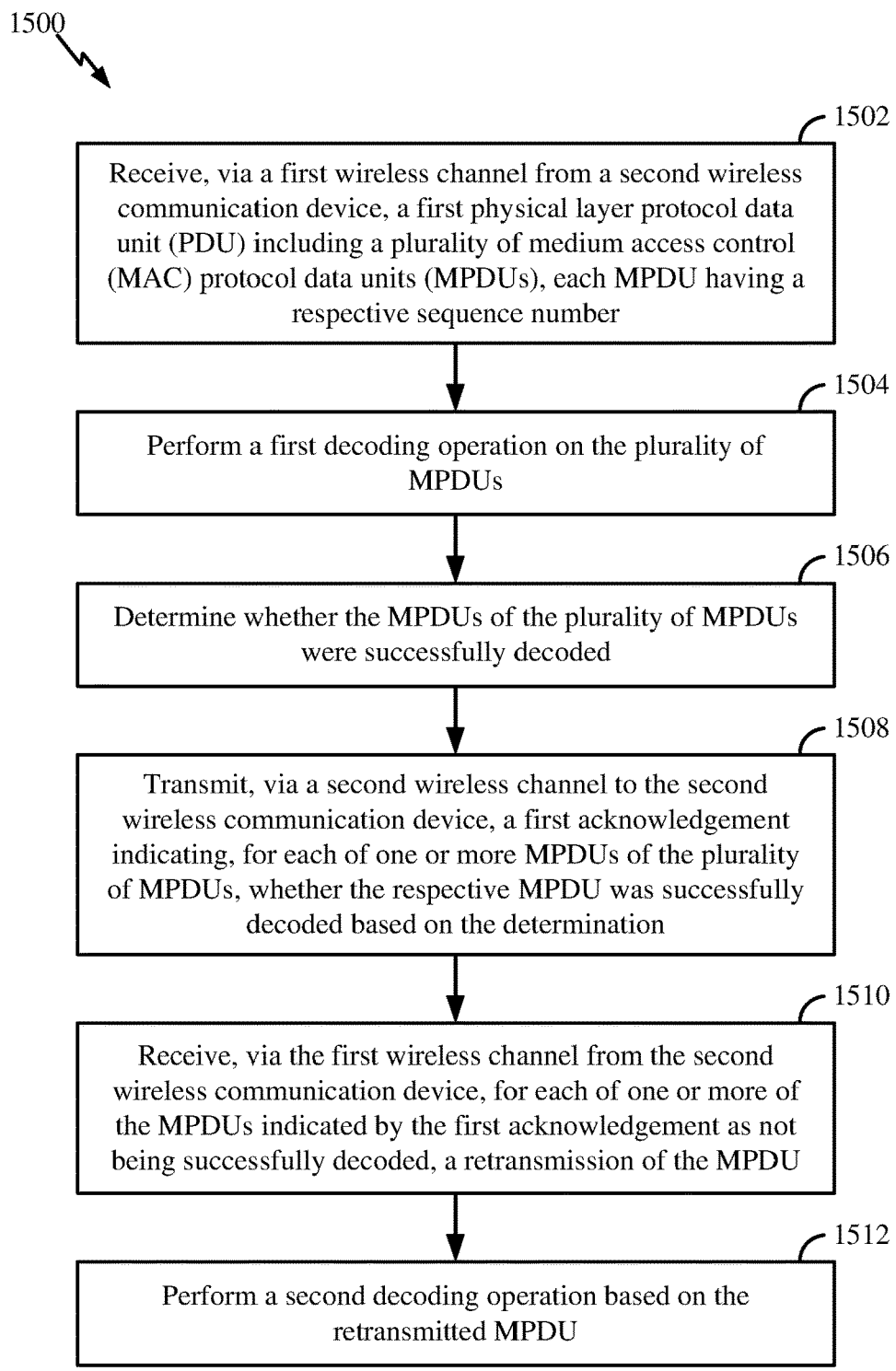
FIG. 15 shows a flowchart illustrating an example process for wireless communication that supports acknowledgement and retransmission techniques according to some implementations.

FIG. 15 shows a flowchart illustrating an example process 1500 for wireless communication that supports acknowledgement and retransmission techniques according to some implementations. The operations of the process 1500 may be implemented by a receiving device, such as an AP or a STA, or components thereof, as described herein. For example, the process 1500 may be performed by a wireless communication device such as the wireless communication device 500 described above with reference to FIG. 5. In some implementations, the process 1500 may be performed by an AP, such as one of the APs 102 and 602 described above with reference to FIGS. 1 and 6A, respectively. In some implementations, the process 1500 may be performed by a STA, such as one of the STAs 104 and 604 described above with reference to FIGS. 1 and 6B, respectively.

In some implementations, the receiving device is configured for dual band simultaneous communication. For example, the receiving device may include a first radio for communicating with a transmitting device via a first wireless link in a first band, and may include a second radio for communicating with the transmitting device via a second wireless link in a different subband of the first band or in a second band. In some implementations, the receiving device is further configured for multilink aggregation. For example, the receiving device may be configured to aggregate the first and the second wireless links to enable simultaneous reception from the transmitting device and transmission to the transmitting device.

In block 1502, the receiving device receives, via a first wireless channel of a first wireless link from a transmitting device, a first wireless packet including multiple MPDUs. The receiving device may receive the first wireless packet in the form of a first PHY level PDU, and more specifically, a first PPDU including a PSDU payload that contains encoded bits representing the MPDUs. The receiving device may receive the first wireless packet over the first wireless channel via one or more coupled antennas and utilizing any suitable techniques including SU-MIMO, MU-MIMO and OFDMA techniques conforming to one or more of the IEEE 802.11 family of wireless communication protocol standards (such as that defined by the IEEE 802.11-2016 specification or amendments thereof including, but not limited to, 802.11ax and 802.11be). In some implementations, the first wireless channel can be a 20 MHz, 40 MHz, 80 MHz, 160 MHz or 320 MHz channel including one or more contiguous or non-contiguous portions.

In block 1504, the receiving device may perform a first decoding operation on the multiple MPDUs in an attempt to decode the multiple MPDUs. In block 1506, the receiving device determines whether MPDUs of the multiple MPDUs were successfully decoded in block 1504. In some implementations, for each of the MPDUs that was successfully decoded, the receiving device may deallocate the memory resources used to store the respective MPDU, and as such, free up memory resources that may be allocated to new data.

In some implementations, in block 1508, the receiving device transmits, via a second wireless channel of a second wireless link to the transmitting device, an acknowledgement (such as a block acknowledgement) based on the determinations made in block 1506. In some implementations, the second wireless channel can be a 20 MHz channel not within and not overlapping with the first wireless channel. In some other implementations, the first wireless channel may consist of a first set of tones of a 20 MHz, 40 MHz, 80 MHz, 160 MHz or 320 MHz wireless channel, and the second wireless channel may consist of a second set of different tones of the same 20 MHz, 40 MHz, 80 MHz, 160 MHz or 320 MHz wireless channel.

By transmitting the acknowledgement on a different wireless channel than the first wireless channel, the receiving device may transmit, and the transmitting device may receive, the acknowledgement within a duration of the first wireless packet. In this way, the receiving device can continue its reception of the first wireless packet while transmitting the acknowledgement for one or more first MPDUs of the multiple MPDUs to be transmitted in the first wireless packet. In some implementations, the acknowledgement indicates, for each MPDU of one or more received MPDUs in the first wireless packet, whether the respective MPDU was successfully decoded by the receiving device. For example, the acknowledgement may be a block acknowledgement that includes a bitmap in which a binary value of each bit indicates whether a respective one of the MPDUs was successfully decoded (an example of an ACK).

Subsequently, in block 1510, the receiving device may receive, via the first wireless channel from the transmitting device, a retransmission of each of one or more of the MPDUs indicated by the acknowledgement as not being successfully decoded. In block 1512, the receiving device may then perform a second decoding operation based on the respective retransmissions of the MPDUs as similarly described for block 1504. This process may repeat until each MPDU is successfully decoded. As described above, for each of the MPDUs that was successfully decoded, the receiving device may deallocate the memory resources used to store the respective MPDU, and as such, free up memory resources that may be allocated to new data. The successfully decoded MPDUs may then be arranged according to their sequence numbers before forwarding to an upper layer.

In some implementations, the receiving device may receive the retransmissions of the MPDUs in a second, subsequent wireless packet, which may be transmitted within the same TXOP as the first wireless packet. In some such implementations, the payload of the second wireless packet may contain only the retransmitted MPDUs, and not any new data. In some other implementations, the receiving device may receive a second wireless packet that includes the retransmitted MPDUs as well as new MPDUs that have not been previously transmitted. In some other implementations, the receiving device may receive the retransmitted MPDUs in the same first wireless packet in which the unsuccessfully decoded MPDUs were originally received. As described above, by transmitting an acknowledgement on a second, different wireless channel, the receiving device may continue its reception of the first wireless packet while transmitting the acknowledgement for one or more first MPDUs in the first wireless packet. This, in turn, enables the receiving device to receive retransmitted MPDUs in the same wireless packet in which the unsuccessfully decoded MPDUs were originally transmitted. For example, the receiving device may transmit acknowledgements on a per-MPDU or per-group-of-MPDUs (such as using a block acknowledgement) basis. In such an example, the receiving device may transmit multiple acknowledgements to acknowledge all of the MPDUs in a given wireless packet.

As described above, in some implementations, to further reduce latency in the wireless network, the second wireless channel also can be used for data communications. For example, the receiving device for the first wireless packet may transmit, on the second wireless channel, a second wireless packet to the transmitting device of the first wireless packet. In some such implementations, the receiving device of the first wireless packet may combine the acknowledgement for the first wireless packet with additional MPDUs in the second wireless packet. As described above, in some implementations in which either of the transmitting device or the receiving device is an AP, the AP can control the transmission and acknowledgement sequences on both the first and the second wireless channels and otherwise coordinate the transmissions. For example, the AP may coordinate the transmissions such that when the transmitting device is transmitting data to the receiving device on the first wireless channel, the receiving device is transmitting data to the transmitting device on the second wireless channel. In other words, when one of the wireless channels is used for DL transmissions, the other of the wireless channels is used for UL transmissions.

Figure 16:
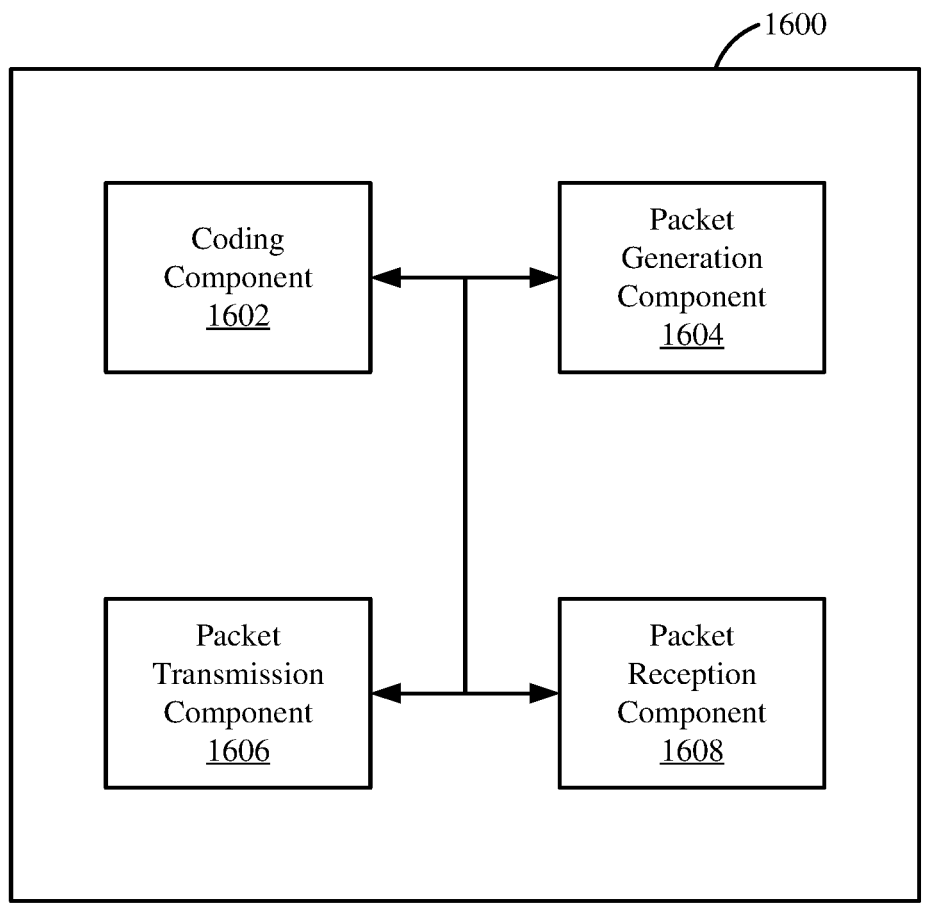
FIG. 16 shows a block diagram of an example wireless communication device according to some implementations.

FIG. 16 shows a block diagram of an example wireless communication device 1600 according to some implementations. In some implementations, the wireless communication device 1600 is configured to perform the process 900 described with reference to FIG. 9. In some implementations, the wireless communication device 1600 also is configured to perform the process 1300 described with reference to FIG. 13. The wireless communication device 1600 may be an example implementation of the wireless communication device 500 described above with reference to FIG. 5. For example, the wireless communication device 1600 can be a chip, SoC, chipset, package or device that includes at least one processor and at least one modem (for example, a Wi-Fi (IEEE 802.11) modem or a cellular modem). In some implementations, the wireless communication device 1600 can be a device for use in an AP, such as one of the APs 102 and 602 described above with reference to FIGS. 1 and 6A, respectively, or for use in a STA, such as one of the STAs 104 and 604 described with reference to FIGS. 1 and 6B, respectively. In some other implementations, the wireless communication device 1600 can be an AP or a STA that includes such a chip, SoC, chipset, package or device as well as at least one transmitter, at least one receiver, and at least one antenna.

The wireless communication device 1600 includes a coding component 1602, a packet generation component 1604, a packet transmission component 1606, and a packet reception component 1608. At least portions of one or more of the components 1602, 1604, 1606 and 1608 may be implemented at least in part in hardware or firmware. For example, the coding component 1602, the packet generation component 1604, the packet transmission component 1606 and the packet reception component 1608 may be implemented at least in part by a modem (such as the modem 502 described above with reference to FIG. 5). In some implementations, portions of one or more of the components may be implemented at least in part as software stored in a memory (such as the memory 508), for example, in the form of non-transitory instructions (or "code") executable by a processor (such as the processor 506) to perform functions or operations of the respective component.

The coding component 1602 is configured to generate multiple codewords, each codeword including respective primary information. For example, the coding component 1602 may be configured to perform block 902 of the process 900 described with reference to FIG. 9. In particular, the coding component 1602 may receive bits for an A-MPDU that includes multiple MPDUs from a MAC layer in the form of a PSDU, divide the bits in the PSDU into one or more code blocks, and allocate memory resources for processing the code blocks. In some implementations, the coding component 1602 includes an LDPC encoder that encodes the code blocks to generate the codewords. In some implementations, on a per-code-block basis, the LDPC encoder receives a code block including primary information and generates parity information based on the primary information. The parity information may then be stored with the respective primary information in the allocated memory resources. The encoder combines the primary information for each code block with the parity information generated for the code block to generate a codeword.

The packet generation component 1604 is configured to generate a first wireless packet that includes the codewords generated by the coding component 1602. For example, the packet generation component 1604 may be configured to perform block 904 of the process 900 described with reference to FIG. 9. In particular, the packet generation component 1604 may generate the first wireless packet in the form of a first PPDU including a PSDU payload that contains the codewords. The packet transmission component 1606 is configured to transmit the first wireless packet to a receiving device via a first wireless channel of a first wireless link. For example, the packet transmission component 1606 may be configured to perform blocks 906 and 910 of the process 900 described with reference to FIG. 9. In particular, the packet transmission component 1606 may transmit the first wireless packet over the first wireless channel via one or more coupled antennas and utilizing any suitable techniques as described above.

The packet reception component 1608 is configured to receive a codeword acknowledgement from the receiving device via a second wireless channel of a second wireless link. For example, the packet reception component 1608 may be configured to perform block 908 of the process 900 described with reference to FIG. 9. The packet reception component 1608 may receive the codeword acknowledgement over the second wireless channel via one or more coupled antennas and utilizing any suitable techniques as described above. In some implementations, the packet reception component 1608 may receive the codeword acknowledgement within a duration of the first wireless packet. In this way, the packet transmission component 1606 can continue its transmission of the first wireless packet while packet reception component 1608 receives the codeword acknowledgement for one or more first codewords or first groups of codewords of the multiple codewords to be transmitted in the first wireless packet.

As described above, the codeword acknowledgement may indicate, for each codeword of one or more received codewords in the first wireless packet, or for each of one or more received groups of codewords in the first wireless packet, whether the respective codeword or the respective group of codewords was successfully decoded or not successfully decoded by the receiving device. In some implementations, for each of the codewords that the codeword acknowledgement indicated as being successfully decoded, the wireless communication device may deallocate the memory resources used to store the respective primary information and parity information, and as such, free up memory resources that may be allocated to new data. In some other implementations, the wireless communication device may maintain storage of the primary information and the parity information until it receives indications that all of the codewords in the PSDU were successfully decoded.

For each of one or more of the codewords indicated (either individually or by group) by the codeword acknowledgement as not being successfully decoded, the packet transmission component 1606 transmits via the first wireless channel to the receiving device, a respective instance of parity information based on the respective primary information. In some implementations, to transmit the respective instances of parity information, the packet transmission component 1606 retransmits the entireties of the unsuccessfully decoded codewords including both the primary information and the original parity information. For example, the packet transmission component 1606 may retrieve the primary information and the parity information from memory resources allocated to the codeword and retransmit both the primary information and the original parity information. In some other implementations, the packet transmission component 1606 may not retransmit the primary information associated with the unsuccessfully decoded codewords. As also described above, in some implementations each respective instance of parity information is different than the original instance of parity information previously transmitted with the codeword. In some such implementations, the new instance of parity information includes more parity information than the original instance of parity information.

As similarly described above, after transmitting the respective instances of parity information, the packet reception component 1608 may then receive, via the second wireless channel from the receiving device, a second codeword acknowledgement. The second acknowledgement may indicate, for at least one of the codewords indicated by the first codeword acknowledgement as not being successfully decoded, that the codeword was again not successfully decoded by the receiving device. The packet transmission component 1606 may then transmit an additional instance of parity information. This cycle may repeat for a given codeword as long as the receiving device continues to fail to successfully decode the codeword.

Figure 17:
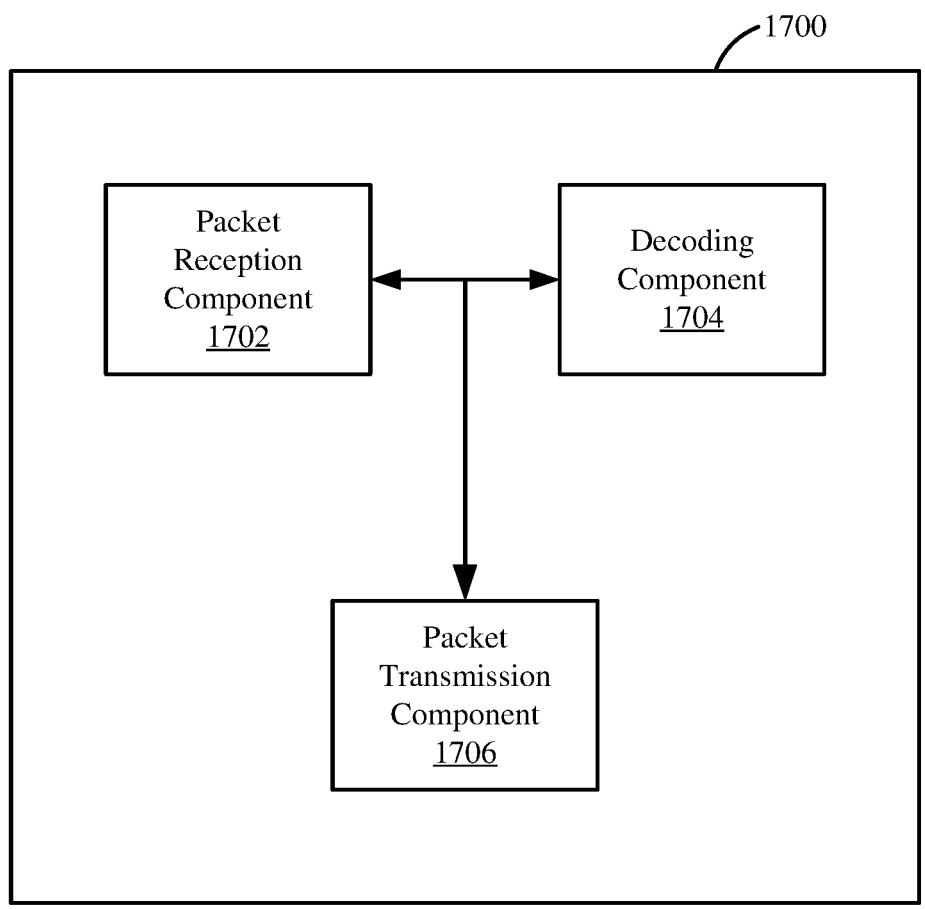
FIG. 17 shows a block diagram of an example wireless communication device according to some implementations.

FIG. 17 shows a block diagram of an example wireless communication device 1700 according to some implementations. In some implementations, the wireless communication device 1700 is configured to perform the process 1300 described with reference to FIG. 13. In some implementations, the wireless communication device 1700 also is configured to perform the process 900 described with reference to FIG. 9. The wireless communication device 1700 may be an example implementation of the wireless communication device 500 described above with reference to FIG. 5. For example, the wireless communication device 1700 can be a chip, SoC, chipset, package or device that includes at least one processor and at least one modem (for example, a Wi-Fi (IEEE 802.11) modem or a cellular modem). In some implementations, the wireless communication device 1700 can be a device for use in an AP, such as one of the APs 102 and 602 described above with reference to FIGS. 1 and 6A, respectively, or for use in a STA, such as one of the STAs 104 and 604 described with reference to FIGS. 1 and 6B, respectively. In some other implementations, the wireless communication device 1700 can be an AP or a STA that includes such a chip, SoC, chipset, package or device as well as at least one transmitter, at least one receiver, and at least one antenna.

The wireless communication device 1700 includes a packet reception component 1702, a decoding component 1704, and a packet transmission component 1706. At least portions of one or more of the components 1702, 1704 and 1706 may be implemented at least in part in hardware or firmware. For example, the packet reception component 1702, the decoding component 1704 and the packet transmission component 1706 may be implemented at least in part by a modem (such as the modem 502 described above with reference to FIG. 5). In some implementations, portions of one or more of the components may be implemented at least in part as software stored in a memory (such as the memory 508), for example, in the form of non-transitory instructions executable by a processor (such as the processor 506) to perform functions or operations of the respective component.

The packet reception component 1702 is configured to receive, via a first wireless channel of a first wireless link from a transmitting device, a first wireless packet including multiple codewords. For example, the packet reception component 1702 may be configured to perform blocks 1302 and 1310 of the process 1300 described with reference to FIG. 13. The packet reception component 1702 may receive the first wireless packet over the first wireless channel via one or more coupled antennas and utilizing any suitable techniques as described above. Each codeword includes a systematic portion that contains primary information representative of some or all of one or more MPDUs in the form of bits. The receiving device may receive the first wireless packet in the form of a first PHY level PDU, and more specifically, a first PPDU including a PSDU payload that contains the codewords. The receiving device may receive the first wireless packet over the first wireless channel via one or more coupled antennas and utilizing any suitable techniques as described above.

The decoding component 1704 is configured to perform a first decoding operation on the multiple codewords in an attempt to decode the codewords. For example, the decoding component 1704 may be configured to perform blocks 1304, 1306 and 1312 of the process 1300 described with reference to FIG. 13. In some implementations, the decoding component 1704 includes an LDPC decoder that decodes the codewords to generate multiple respective code blocks. In some implementations, on a per-codeword basis, the LDPC decoder receives a codeword including primary information and parity information, and combines the primary information with the parity information to decode the codeword and generate a respective code block. The decoding component 1704 determines whether codewords of the multiple codewords were successfully decoded. In some implementations, for each of the codewords that was successfully decoded, the wireless communication device may deallocate the memory resources used to store the respective primary information and parity information, and as such, free up memory resources that may be allocated to new data. In some other implementations, the wireless communication device may maintain storage of the primary information and the parity information until it successfully decodes all of the codewords in the PSDU.

The packet transmission component 1706 is configured to transmit, via a second wireless channel to the transmitting device, a codeword acknowledgement (such as a codeword block acknowledgement) based on the determinations made by the decoding component 1704. For example, the packet transmission component 1706 may be configured to perform block 1308 of the process 1300 described with reference to FIG. 13. The packet transmission component 1706 may transmit the codeword acknowledgement over the second wireless channel via one or more coupled antennas and utilizing any suitable techniques as described above. By transmitting the codeword acknowledgement on a different wireless channel than the first wireless channel, the packet transmission component 1706 may transmit the codeword acknowledgement within a duration of the first wireless packet. In this way, the packet reception component 1702 can continue its reception of the first wireless packet while the packet transmission component 1706 transmits the codeword acknowledgement for one or more first codewords or first groups of codewords of the multiple codewords to be received in the first wireless packet.

In some implementations, the codeword acknowledgement indicates, for each codeword of one or more received codewords in the first wireless packet, or for each of one or more received groups of codewords in the first wireless packet, whether the respective codeword or the respective group of codewords was successfully decoded or not successfully decoded by the receiving device. The packet reception component 1702 is further configured to receive, via the first wireless channel from the transmitting device, an instance of parity information associated with the respective primary information corresponding to each of one or more of the codewords indicated by the codeword acknowledgement as not being successfully decoded. In some implementations, retransmits the entireties of the unsuccessfully decoded codewords including both the primary information and the original parity information. In some other implementations, the transmitting device may not retransmit the primary information associated with the unsuccessfully decoded codewords. As also described above, in some implementations each respective instance of parity information is different than the original instance of parity information previously transmitted with the codeword. In some such implementations, the new instance of parity information includes more parity information than the original instance of parity information.

The decoding component 1704 is further configured to perform a second decoding operation based on the respective instances of parity information. For example, in some implementations the performance of the second decoding operation combines the primary information and first instance of parity information associated with each of the codewords with the second instance of parity information for the codeword. This process may repeat until each codeword is successfully decoded and, as described above, each additional instance of parity information associated with a codeword may improve the probability of accurately decoding the respective primary information.

Figure 18:
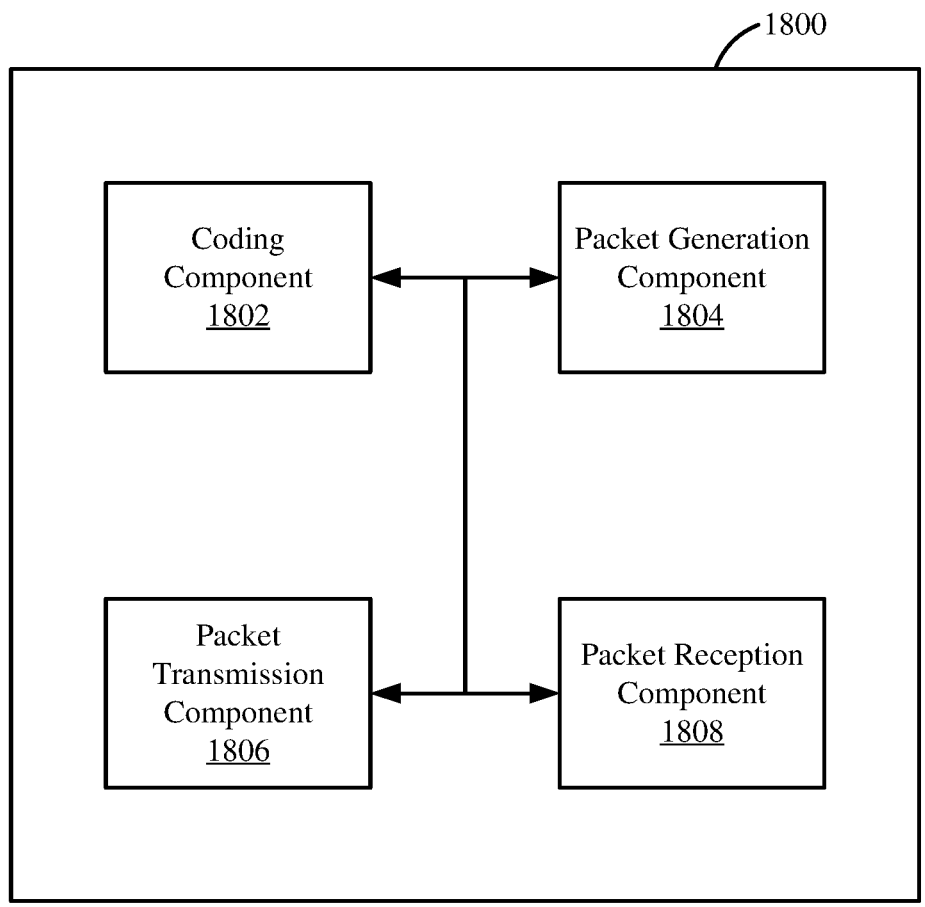
FIG. 18 shows a block diagram of an example wireless communication device according to some implementations.

FIG. 18 shows a block diagram of an example wireless communication device 1800 according to some implementations. In some implementations, the wireless communication device 1800 is configured to perform the process 1400 described with reference to FIG. 14. In some implementations, the wireless communication device 1800 also is configured to perform the process 1500 described with reference to FIG. 15. The wireless communication device 1800 may be an example implementation of the wireless communication device 500 described above with reference to FIG. 5. For example, the wireless communication device 1800 can be a chip, SoC, chipset, package or device that includes at least one processor and at least one modem (for example, a Wi-Fi (IEEE 802.11) modem or a cellular modem). In some implementations, the wireless communication device 1800 can be a device for use in an AP, such as one of the APs 102 and 602 described above with reference to FIGS. 1 and 6A, respectively, or for use in a STA, such as one of the STAs 104 and 604 described with reference to FIGS. 1 and 6B, respectively. In some other implementations, the wireless communication device 1800 can be an AP or a STA that includes such a chip, SoC, chipset, package or device as well as at least one transmitter, at least one receiver, and at least one antenna.

The wireless communication device 1800 includes a coding component 1802, a packet generation component 1804, a packet transmission component 1806, and a packet reception component 1808. At least portions of one or more of the components 1802, 1804, 1806 and 1808 may be implemented at least in part in hardware or firmware. For example, the coding component 1802, the packet generation component 1804, the packet transmission component 1806 and the packet reception component 1808 may be implemented at least in part by PHY layer including a modem (such as the modem 502 described above with reference to FIG. 5). In some implementations, portions of one or more of the components may be implemented at least in part as software stored in a memory (such as the memory 508), for example, in the form of non-transitory instructions (or "code") executable by a processor (such as the processor 506) to perform functions or operations of the respective component. For example, the coding component 1802 may be implemented at least in part by a MAC layer of the wireless communication device.

The coding component 1802 is configured to generate multiple MPDUs, each MPDU having a respective sequence number. For example, the coding component 1802 may be configured to perform block 1402 of the process 1400 described with reference to FIG. 14. For example, the coding component 1802 may receive one or more higher layer data units from an upper layer of the transmitting device, allocate memory resources for processing the data units, and encode the data units to generate the multiple MPDUs. Each MPDU is stored in the allocated memory resources and includes a systematic portion that contains primary information (or "systematic information") representative of some or all of one or more of the upper layer data units. The MPDUs may then be provided to a PHY layer to generate multiple respective codewords as described above.

The packet generation component 1804 is configured to generate a first wireless packet including the MPDUs generated by the coding component 1802. For example, the packet generation component 1804 may be configured to perform block 1404 of the process 1400 described with reference to FIG. 14. For example, the packet generation component 1804 may generate the first wireless packet in the form of a first PHY level PDU, and more specifically, a first PPDU including a PSDU payload that includes encoded bits representing the MPDUs. The packet transmission component 1806 is configured to transmit the first wireless packet to a receiving device via a first wireless channel. For example, the packet transmission component 1806 may be configured to perform blocks 1406 and 1410 of the process 1400 described with reference to FIG. 14. The packet transmission component 1806 may transmit the first wireless packet over the first wireless channel via one or more coupled antennas and utilizing any suitable techniques as described above.

The packet reception component 1808 is configured to receive an acknowledgement (such as a block acknowledgement) from the receiving device via a second wireless channel of a second wireless link. For example, the packet reception component 1808 may be configured to perform block 1408 of the process 1400 described with reference to FIG. 14. The packet reception component 1808 may receive the first wireless packet over the first wireless channel via one or more coupled antennas and utilizing any suitable techniques as described above. By receiving the acknowledgement on a different wireless channel than the first wireless channel, the packet reception component 1808 may receive the acknowledgement within a duration of the first wireless packet. In this way, the packet transmission component 1806 can continue its transmission of the first wireless packet while the packet reception component 1808 receives an acknowledgement for one or more first MPDUs of the multiple MPDUs to be transmitted in the first wireless packet.

In some implementations, the acknowledgement indicates, for each MPDU of one or more received MPDUs in the first wireless packet, whether the respective MPDU was successfully decoded by the receiving device. In some implementations, for each of the MPDUs that the acknowledgement indicated as being successfully decoded, the wireless communication device may deallocate the memory resources used to store the respective MPDU, and as such, free up memory resources that may be allocated to new data. For each of one or more of the MPDUs indicated by the acknowledgement as not being successfully decoded, the packet transmission component 1806 retransmits the respective MPDU via the first wireless channel to the receiving device. As similarly described above, after retransmitting the previously unsuccessfully decoded MPDUs, the packet reception component 1808 may then receive, via the second wireless channel from the receiving device, a second acknowledgement (such as a block acknowledgement). The second acknowledgement may indicate, for at least one of the MPDUs indicated by the first acknowledgement as not being successfully decoded, that the MPDU was again not successfully decoded by the receiving device. The packet transmission component 1806 may then retransmit the MPDU again. This cycle may repeat for a given MPDU as long as the receiving device continues to fail to successfully decode the MPDU.

Figure 19:
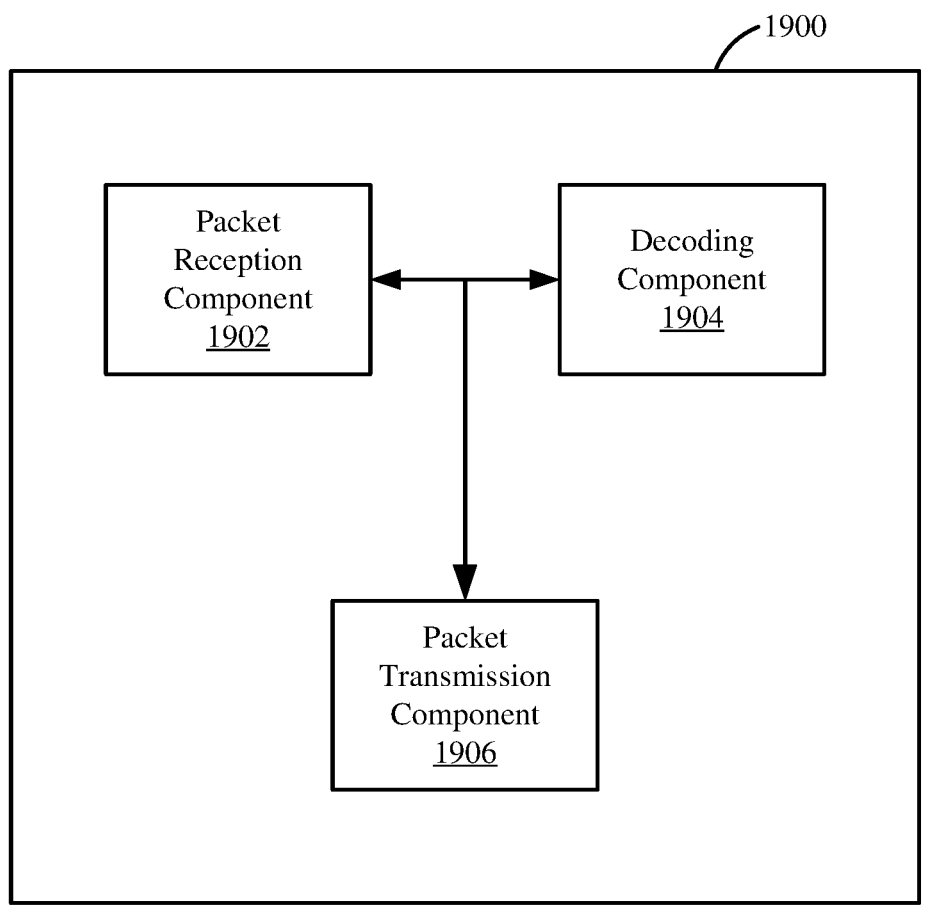
FIG. 19 shows a block diagram of an example wireless communication device according to some implementations.

FIG. 19 shows a block diagram of an example wireless communication device 1900 according to some implementations. In some implementations, the wireless communication device 1900 is configured to perform the process 1500 described with reference to FIG. 15. In some implementations, the wireless communication device 1900 also is configured to perform the process 1400 described with reference to FIG. 14. The wireless communication device 1900 may be an example implementation of the wireless communication device 500 described above with reference to FIG. 5. For example, the wireless communication device 1900 can be a chip, SoC, chipset, package or device that includes at least one processor and at least one modem (for example, a Wi-Fi (IEEE 802.11) modem or a cellular modem). In some implementations, the wireless communication device 1900 can be a device for use in an AP, such as one of the APs 102 and 602 described above with reference to FIGS. 1 and 6A, respectively, or for use in a STA, such as one of the STAs 104 and 604 described with reference to FIGS. 1 and 6B, respectively. In some other implementations, the wireless communication device 1900 can be an AP or a STA that includes such a chip, SoC, chipset, package or device as well as at least one transmitter, at least one receiver, and at least one antenna.

The wireless communication device 1900 includes a packet reception component 1902, a decoding component 1904, and a packet transmission component 1906. At least portions of one or more of the components 1902, 1904 and 1906 may be implemented at least in part in hardware or firmware. For example, the packet reception component 1902, the decoding component 1904 and the packet transmission component 1906 may be implemented at least in part by a modem (such as the modem 502 described above with reference to FIG. 5). In some implementations, portions of one or more of the components may be implemented at least in part as software stored in a memory (such as the memory 508), for example, in the form of non-transitory instructions executable by a processor (such as the processor 506) to perform functions or operations of the respective component. For example, the decoding component 1904 may be implemented in part by a MAC layer of the wireless communication device.

The packet reception component 1902 is configured to receive, via a first wireless channel of a first wireless link from a second wireless communication device, a first wireless packet including multiple MPDUs. For example, the packet reception component 1902 may be configured to perform block 1502 of the process 1500 described with reference to FIG. 15. The packet reception component 1902 may receive the first wireless packet over the first wireless channel via one or more coupled antennas and utilizing any suitable techniques as described above. For example, the packet reception component 1902 may receive the first wireless packet in the form of a first PHY level PDU, and more specifically, a first PPDU including a PSDU payload that contains encoded bits representing the MPDUs.

The decoding component 1904 is configured to perform a first decoding operation on the multiple MPDUs in an attempt to decode the multiple MPDUs. For example, the decoding component 1904 may be configured to perform blocks 1504 and 1512 of the process 1500 described with reference to FIG. 15. The decoding component 1904 determines whether MPDUs of the multiple MPDUs were successfully decoded. In some implementations, for each of the MPDUs that was successfully decoded, the wireless communication device may deallocate the memory resources used to store the respective MPDU, and as such, free up memory resources that may be allocated to new data.

The packet transmission component 1906 is configured to transmit, via a second wireless channel of a second wireless link to the second wireless communication device, an acknowledgement (such as a block acknowledgement) based on the determinations made by the decoding component 1904. For example, the packet transmission component 1906 may be configured to perform block 1508 of the process 1500 described with reference to FIG. 15. The packet transmission component 1906 may transmit the acknowledgement over the second wireless channel via one or more coupled antennas and utilizing any suitable techniques as described above. By transmitting the acknowledgement on a different wireless channel than the first wireless channel, the packet transmission component 1906 may transmit the acknowledgement within a duration of the first wireless packet. In this way, the packet reception component 1902 can continue its reception of the first wireless packet while the packet transmission component 1906 transmits the acknowledgement for one or more first MPDUs of the multiple MPDUs to be received in the first wireless packet. In some implementations, the acknowledgement indicates, for each MPDU of one or more received MPDUs in the first wireless packet, whether the respective MPDU was successfully decoded by the receiving device.

The packet reception component 1902 is further configured to receive, via the first wireless channel from the transmitting device, a retransmission of each of one or more of the MPDUs indicated by the acknowledgement as not being successfully decoded. The decoding component 1904 is further configured to perform a second decoding operation based on the respective retransmissions of the MPDUs. This process may repeat until each MPDU is successfully decoded. As described above, for each of the MPDUs that was successfully decoded, the receiving device may deallocate the memory resources used to store the respective MPDU, and as such, free up memory resources that may be allocated to new data. The successfully decoded MPDUs may then be arranged according to their sequence numbers before forwarding to an upper layer.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

The various illustrative components, logic, logical blocks, modules, circuits, operations and algorithm processes described in connection with the implementations disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A method for wireless communication by a first wireless communication device, comprising:
   generating a plurality of codewords, each codeword including respective primary information;
   generating a first physical layer protocol data unit (PDU) including the plurality of codewords, the generation of the first physical layer PDU including:
      obtaining a plurality of code blocks, each code block including respective primary information in the form of a plurality of data bits; and
      for each of the code blocks generating parity information based on encoding the respective primary information and combining at least a portion of the parity information with the primary information to generate a respective one of the codewords of the plurality of codewords;
   transmitting, via a first wireless channel of a first wireless link to a second wireless communication device, the first PDU;
   receiving, via a second wireless channel of a second wireless link from the second wireless communication device, a first codeword acknowledgement indicating, for each of one or more codewords or for each of one or more groups of codewords of a plurality of groups of codewords of the plurality of codewords, whether the respective codeword or the respective group of codewords was successfully decoded by the second wireless communication device; and
   transmitting, via the first wireless channel to the second wireless communication device, for one or more of the codewords indicated by the first codeword acknowledgement as not being successfully decoded, a respective instance of parity information based on the respective primary information.

2. The method of claim 1, wherein:
   the first wireless channel includes a first 20 MHz, 40 MHz, 80 MHz, 160 MHz or 320 MHz wireless channel, and the second wireless channel includes a 20 MHz wireless channel not in the first wireless channel; or
   the first wireless channel consists of a first set of tones of a 20 MHz, 40 MHz, 80 MHz, 160 MHz or 320 MHz wireless channel, and the second wireless channel consists of a second set of different tones of the 20 MHz, 40 MHz, 80 MHz, 160 MHz or 320 MHz wireless channel.

3. The method of claim 1, further comprising:
   allocating memory resources for physical (PHY) layer processing of a frame, the allocation of the memory resources including storing the respective primary information and the respective parity information for each codeword of the plurality of codewords in the allocated memory resources; and
   deallocating memory resources of the allocated memory resources associated with the respective codewords that were indicated by the first codeword acknowledgement as being successfully decoded.

4. The method of claim 1, wherein:
   for each of one or more of the codewords, the combination of the parity information with the primary information includes less than all of the parity information generated based on the primary information; and
   the transmission of the respective instance of parity information based on the respective primary information comprises transmitting less than all of the parity information generated based on the primary information.

5. The method of claim 4, wherein the generation of the parity information for each of the one or more code blocks includes generating a plurality of instances of parity information for each of the one or more code blocks, wherein the combination of the parity information with the primary information in each of the one or more codewords includes only a first instance of parity information of the plurality of instances of parity information associated with the respective code block, and wherein the transmission of the respective instance of parity information based on the first codeword acknowledgement comprises transmitting a second instance of parity information of the plurality of instances of parity information associated with the code block.

6. The method of claim 5, further comprising, for each of one or more of the code blocks, dividing the respective parity information into a plurality of subsets of parity bits, each of the instances of parity information for the code block consisting of a corresponding one of the subsets of parity bits, wherein the first instance of parity information includes only a first subset of parity bits of the plurality of subsets of parity bits associated with the respective code block, and wherein the second instance of parity information includes only a second subset of parity bits of the plurality of parity bits associated with the code block.

7. The method of claim 5, further comprising:
   receiving, via the second wireless channel from the second wireless communication device after transmitting the one or more respective instances of parity information, a second codeword acknowledgement indicating, for at least one of the codewords indicated by the first codeword acknowledgement as not being successfully decoded, that the codeword was not successfully decoded by the second wireless communication device;
transmitting, via the first wireless channel to the second wireless communication device, for the at least one codeword, a last remaining instance of parity information of the plurality of instances of parity information associated with the codeword;
receiving, via the second wireless channel from the second wireless communication device after transmitting the last remaining instance of parity information, a third codeword acknowledgement indicating that the at least one codeword was not successfully decoded by the second wireless communication device; and
retransmitting the entire first PDU based on the third codeword acknowledgement.

8. The method of claim 1, further comprising, in response to the first codeword acknowledgement, for each codeword indicated by the first codeword acknowledgement as not being successfully decoded, dynamically generating the respective instance of parity information.

9. The method of claim 1, further comprising, for each of one or more of the codewords indicated by the first codeword acknowledgement as not being successfully decoded, refraining from retransmitting the respective primary information with the transmission of the respective instance of parity information.

10. The method of claim 1, further comprising, for each of one or more of the codewords indicated by the first codeword acknowledgement as not being successfully decoded:
retrieving the respective primary information from memory in response to determining that the respective codeword was not successfully decoded by the second wireless communication device; and
retransmitting the retrieved primary information with the transmission of the respective instance of parity information.

11. The method of claim 1, further comprising, for each of one or more of the codewords indicated by the first codeword acknowledgement as not being successfully decoded:
regenerating the primary information in response to determining that the respective codeword was not successfully decoded by the second wireless communication device; and
transmitting the regenerated primary information with the transmission of the respective instance of parity information.

12. The method of claim 1, wherein:
the first codeword acknowledgement is received within a duration of the first PDU; and
the transmission of the respective instance of parity information associated with at least one of the codewords indicated by the first codeword acknowledgement as not being successfully decoded is within the first PDU.

13. The method of claim 1, further comprising:
generating a second PHY layer PDU including a plurality of codewords, the second PDU further including, for at least one of the codewords indicated by the first codeword acknowledgement as not being successfully decoded in the first PDU, the respective instance of parity information; and
transmitting, via the first wireless channel to the second wireless communication device, the second PDU, wherein the transmissions of the one or more respective instances of parity information are included in the transmission of the second PDU.

14. A method for wireless communication by a first wireless communication device, comprising:
receiving, via a first wireless channel of a first wireless link from a second wireless communication device, a first physical layer protocol data unit (PDU) including a plurality of codewords, each codeword including respective primary information and a respective first instance of parity information;
performing a first decoding operation on the plurality of codewords that includes, for each of the codewords, combining the respective first instance of parity information with the respective primary information to generate a respective code block;
determining whether the codewords of the plurality of codewords were successfully decoded;
transmitting, via a second wireless channel of a second wireless link to the second wireless communication device, a first codeword acknowledgement indicating, for each of one or more codewords or for each of one or more groups of codewords of a plurality of groups of codewords of the plurality of codewords, whether the respective codeword or the respective group of codewords was successfully decoded based on the determination;
receiving, via the first wireless channel from the second wireless communication device, for one or more of the codewords indicated by the first codeword acknowledgement as not being successfully decoded, a respective second instance of parity information associated with the respective primary information; and
performing a second decoding operation based on the respective second instances of parity information.

15. The method of claim 14, wherein:
the first wireless channel includes a first 20 MHz, 40 MHz, 80 MHz, 160 MHz or 320 MHz wireless channel, and wherein the second wireless channel includes a 20 MHz wireless channel not in the first wireless channel; or
the first wireless channel consists of a first set of tones of a 20 MHz, 40 MHz, 80 MHz, 160 MHz or 320 MHz wireless channel, and wherein the second wireless channel consists of a second set of different tones of the 20 MHz, 40 MHz, 80 MHz, 160 MHz or 320 MHz wireless channel.

16. The method of claim 14, wherein the instance of parity information associated with each of the codewords is a second instance of parity information, wherein each codeword of the plurality of codewords further includes a first instance of parity information, and wherein the method further comprises:
allocating memory resources for physical (PHY) layer processing of a frame, the allocation of the memory resources including storing the respective primary information and the respective instances of parity information for each codeword of the plurality of codewords in the allocated memory resources; and
deallocating memory resources of the allocated memory resources associated with the respective codewords that were successfully decoded.

17. The method of claim 14, further comprising, for each of one or more of the codewords indicated by the first codeword acknowledgement as not being successfully decoded, receiving a retransmission of the respective primary information with the instance of parity information.

18. The method of claim 14, wherein:
the transmission of the first codeword acknowledgement is within a duration of the first PDU; and
at least one of the respective instances of parity information associated with at least one of the codewords indicated by the first codeword acknowledgement as not being successfully decoded is received within the first PDU.

19. The method of claim 14, further comprising receiving a second PHY layer PDU after the transmission of the first codeword acknowledgement, wherein at least one of the instances of parity information associated with at least one of the codewords indicated by the first codeword acknowledgement as not being successfully decoded is received within the second PDU.

20. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to cause the wireless communication device to:
generate a plurality of codewords, each codeword including respective primary information, the generation of the plurality of codewords including:
obtaining a plurality of code blocks, each code block including respective primary information in the form of a plurality of data bits; and
for each of the code blocks generating parity information based on encoding the respective primary information and combining at least a portion of the parity information with the primary information to generate a respective one of the codewords of the plurality of codewords;
generate a first physical layer protocol data unit (PDU) including the plurality of codewords;
transmit, via a first wireless channel of a first wireless link to a second wireless communication device, the first PDU;
receive, via a second wireless channel of a second wireless link from the second wireless communication device, a first codeword acknowledgement indicating, for each of one or more codewords or for each of one or more groups of codewords of a plurality of groups of codewords of the plurality of codewords, whether the respective codeword or the respective group of codewords was successfully decoded by the second wireless communication device; and
transmit, via the first wireless channel to the second wireless communication device, for one or more of the codewords indicated by the first codeword acknowledgement as not being successfully decoded, a respective instance of parity information based on the respective primary information.

21. The wireless communication device of claim 20, wherein:
for each of one or more of the codewords, the combination of the parity information with the primary information includes less than all of the parity information generated based on the primary information; and
the transmission of the respective instance of parity information based on the respective primary information comprises transmitting less than all of the parity information generated based on the primary information.

22. The wireless communication device of claim 21, wherein to generate the parity information for each of the one or more code blocks, the code, when executed by the at least one processor in conjunction with the at least one modem, is further configured to cause the wireless communication device to generate a plurality of instances of parity information for each of the one or more code blocks, wherein the combination of the parity information with the primary information in each of the one or more codewords includes only a first instance of parity information of the plurality of instances of parity information associated with the respective code block, and wherein the transmission of the respective instance of parity information based on the first codeword acknowledgement comprises transmitting a second instance of parity information of the plurality of instances of parity information associated with the code block.

23. The wireless communication device of claim 20, wherein, in response to the first codeword acknowledgement, the code, when executed by the at least one processor in conjunction with the at least one modem, is further configured to cause the wireless communication device to, for each codeword indicated by the first codeword acknowledgement as not being successfully decoded, dynamically generate the respective instance of parity information.

24. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to cause the wireless communication device to:
receive, via a first wireless channel of a first wireless link from a second wireless communication device, a first physical layer protocol data unit (PDU) including a plurality of codewords, each codeword including respective primary information;
perform a first decoding operation on the plurality of codewords;
determine whether the codewords of the plurality of codewords were successfully decoded;
transmit, via a second wireless channel of a second wireless link to the second wireless communication device, a first codeword acknowledgement indicating, for each of one or more codewords or for each of one or more groups of codewords of a plurality of groups of codewords of the plurality of codewords, whether the respective codeword or the respective group of codewords was successfully decoded based on the determination;
receive, via the first wireless channel from the second wireless communication device, for one or more of the codewords indicated by the first codeword acknowledgement as not being successfully decoded, a respective instance of parity information associated with the respective primary information; and
perform a second decoding operation based on the respective instances of parity information; and
wherein the instance of parity information associated with each of the codewords is a second instance of parity information, wherein each codeword of the plurality of codewords further includes a first instance of parity information, and wherein the performance of the first decoding operation comprises, for each of the codewords, combining the first instance of parity information with the primary information to generate a respective code block.

25. The wireless communication device of claim 24, wherein the code, when executed by the at least one processor in conjunction with the at least one modem, is further configured to cause the wireless communication device to, for each of one or more of the codewords indicated by the first codeword acknowledgement as not being successfully decoded, receive a retransmission of the respective primary information with the instance of parity information.

26. The wireless communication device of claim 24, wherein the code, when executed by the at least one processor in conjunction with the at least one modem, is further configured to cause the wireless communication device to receive a second PHY layer PDU after the transmission of the first codeword acknowledgement, wherein at least one of the instances of parity information associated with at least one of the codewords indicated by the first codeword acknowledgement as not being successfully decoded is received within the second PDU.

* * * * *